United States Patent [19]
Bamji et al.

[11] Patent Number: 5,663,891
[45] Date of Patent: Sep. 2, 1997

[54] OPTIMIZATION OF MULTIPLE PERFORMANCE CRITERIA OF INTEGRATED CIRCUITS BY EXPANDING A CONSTRAINT GRAPH WITH SUBGRAPHS DERIVED FROM MULTIPLE PWL CONVEX COST FUNCTIONS

[75] Inventors: Cyrus Bamji, Fremont; Enrico Malavasi, Santa Clara, both of Calif.

[73] Assignee: Cadence Design Systems, Inc., San Jose, Calif.

[21] Appl. No.: 627,080

[22] Filed: Apr. 3, 1996

[51] Int. Cl.[6] .................................................. G06F 17/50
[52] U.S. Cl. ............................................ 364/490; 364/488
[58] Field of Search ........................... 364/488, 489, 364/490, 491, 578

[56] References Cited

U.S. PATENT DOCUMENTS

| | | | |
|---|---|---|---|
| 4,745,084 | 5/1988 | Rowson et al. | 437/51 |
| 4,918,614 | 4/1990 | Modarres et al. | 364/490 |
| 5,257,201 | 10/1993 | Berman et al. | 364/489 |
| 5,557,531 | 9/1996 | Rostoker et al. | 364/489 |

OTHER PUBLICATIONS

Stapper, C.H., "Modeling of Defects in Integrated Circuit Photolithographic Patterns", IBM, J. Res. Develop., vol. 28, No. 4, pp. 461–475, Jul., 1984.

Maly, Wojciech, "Cost of Silicon Viewed from VLSI Design Perspective", 31st ACM/IEEE Design Automation Conference, pp. 135–142, 1994.

(List continued on next page.)

*Primary Examiner*—Kevin J. Teska
*Assistant Examiner*—Leigh Marie Garbowski
*Attorney, Agent, or Firm*—Fenwick & West LLP

[57] ABSTRACT

A system, method, and software product in a computer aided design apparatus for system design, to simultaneously optimize multiple performance criteria models of the system, where the performance criteria models are characterized by convex cost functions based on linear dimensional characteristics of system being designed. One embodiment is provided in a computer aid design environment for integrated circuit design, and used to simultaneously optimize fabrication yield along with other performance criteria. Optimization is provided by converting a structural description of an integrated circuit into a constraint graph, compacting, and modifying the constraint graph to include convex cost functions for selected performance criteria to optimized, such as yield cost functions. The cost functions are then transformed to piecewise linear cost functions. The constraint graph is then expanded by replacing edges having piecewise linear cost function with subgraphs constructed from the piecewise linear cost function. The expanded constraint graph is then minimized using a network flow algorithm. Once minimized, the constraint graph describes the positions of circuit elements that maximize yield (and other selected performance criteria) given the cost functions.

15 Claims, 13 Drawing Sheets

OTHER PUBLICATIONS

Pitaksanonkul, A., Thanawastien, S., Lurinsap, C., Gandhi, J.A., "DTR: A Defect–Tolerant Routing Algorithm", 26th ACM/IEEE Design Automation Conference, pp. 795–799, 1989.

Strojwas, Andrezej J., "Design for Manufacturability and Yield", 26th ACM/IEEE Design Automation Conference, pp. 454–458, 1989.

Stapper, Charles H., and Rosner, Raymond J., "Integrated Circuit Yield Management and Yield Analysis: Development and Implementation", IEEE Transactions on Semiconductor Manufacturing, vol. 8, No. 2, pp. 95–102, May, 1995.

Kuo, Sy–Yen, "YOR: A Yield–Optimizing Routing Algorithm by Minimizing Critical Areas and Vias", IEEE Transactions on Computer–Aided Design of Integrated Circuits and Systems, vol. 12, No. 9, pp. 1303–1311, Sep., 1993.

Chiluvuri, Venkat K.R. and Koren, Israel, "Layout–Synthesis for Techniques Yield Enhancement", IEEE Transactions on Semiconductor Manfacturing, vol. 8, No. 2, pp. 178–187, May, 1995.

Huijbregts, Ed P., Xue, Hua and Jess, Jochen A.G., "Routing for Reliable Manufacturing", IEEE Transactions on Semiconductor Manufacturing, vol. 8, No. 2, pp. 188–194, May, 1995.

Xue, Hua, Huijbergts, Ed P. and Jess, Jochen A.G., "Routing for Manufacturability", 31st ACM/IEEE Design Automation Conference, pp. 402–406, 1994.

*Probability of a fault of type OE between wire segments of width W=1, spaced by D*

OPTIMIZATION OF MULTIPLE PERFORMANCE CRITERIA OF INTEGRATED CIRCUITS BY EXPANDING A CONSTRAINT GRAPH WITH SUBGRAPHS DERIVED FROM MULTIPLE PWL CONVEX COST FUNCTIONS

BACKGROUND

1. Field of Invention

This invention relates generally to the field of computer aided design and analysis of structural systems, such as integrated circuits, and more particularly to systems and methods for optimizing performance criteria, such as fabrication yield for such structural systems.

2. Background of Invention

Integrated circuits are one type of structural system commonly designed using computer aided design systems. As with many structural systems, integrated circuits are designed while attempting to satisfy and preferably optimize numerous performance criteria. One such performance criteria is fabrication yield.

Yield is determined in part by the number of electrical failures on a wafer. One of the main sources of electrical failure in VLSI integrated circuits is the presence of spot defects. Spot defects are typically caused by either extra material or missing material at the place where the spot defect occurs. Modeling of the spot defect size distribution is typically used in the calculation of minimum design rules in order to specify the location of circuit elements to reduce the number of spot defects. The choice of the minimum design rules results from a trade off between area and yield considerations. Yield can be increased by using bigger feature sizes and wider spacings than the minimum required by the design rules to reduce spot defects. Therefore, to improve yield it is beneficial to use non-minimum spacings whenever this does not introduce significant area penalty. Due to the very high costs associated with the manufacturing of sub-micron integrated circuits, even a modest yield improvement can be extremely significant. For instance in a modern deep-submicron foundry a 1% yield improvement can be worth over 10M$ per year At the layout design level, conventional methods for improving yield due to spot defect failures fall into two broad complementary categories. In the first category the layout topology is changed to improve yield. This generally involves changing the routing of the components in the layout. Channel routing techniques have been used to minimize the critical areas between wire segments, so that bridging defects are minimized. Also, in a weight-driven area routing approach, the types of faults due to spot defects are considered, using the distributions of spot defects to build a cost function. Although these routing-based approaches have proved somewhat effective in increasing yield, routing is a constructive procedure, whose results are sensitive to net schedule.

In the second category of methods for yield improvement the layout topology is fixed. Components and interconnections are spaced to minimize the probability of faults due to spot defects. One such spacing-based approach uses a heuristic algorithm that increases the spacing of layout objects through a series of spacing iterations. By changing the positions of only objects off the critical path, layout area is maintained at its minimum size.

The above mentioned methods not only do not produce a guaranteed optimized yield but cannot be extended to other performance objectives. Yield is merely one of the performance criteria that must be optimized during integrated circuit design and fabrication. Most industrial applications require the simultaneous optimization of multiple performance objectives in addition to yield, such as power consumption, cross-talk, and wire length.

This problem of simultaneous optimization of multiple criteria is especially difficult to solve. Channel routing typically uses heuristically determined methods that do not support the simultaneous solution of yield and other performance criteria. On the other hand, conventional spacing methods typically rely on cost functions that are linear. However, the cost functions for yield, power, and the like, are non-linear, but rather, convex.

Accordingly, it is desirable to provide a system and method that produces an optimized yield for an integrated circuit. It is further desirable to provide a system and method that simultaneously optimizes a variety of distinct performance criteria having non-linear convex cost functions.

SUMMARY OF THE INVENTION

The present invention overcomes the limitations of existing systems by providing a system, method, and product that guarantees an optimized yield for an integrated circuit. The system and method provide optimized yield for a fixed size IC, or alternatively, provide the maximum number of good IC's per wafer by increasing the size of the IC. In addition, the system and method may be used to simultaneously optimize any number of performance criteria that have convex cost functions.

In accordance with one aspect of the present invention, a system for providing improved IC yield includes a compactor, a layout database, a plurality of performance criteria cost models, a cost function module, a piecewise linear cost function module, and a wire length minimization module. The layout database stores a layout description of the IC, using conventional symbolic elements for layout objects. The layout description is thus a structural description of the IC. The compactor creates a constraint graph of the IC. In one embodiment, the compactor is a one-dimensional compactor, and the constraint graph is a 1D graph, for one axis of the layout. Compaction and optimization is performed separately in each layout direction. The constraint graph includes a plurality of vertices, one for each layout object, and edges coupling adjacent (in a selected direction) objects. Edges in the constraint graph may have cost functions dependent on edge length. Minimizing the constraint graph means minimizing the sum of the cost of all edges in the constraint graph subject to edge constraints. Where the cost function is linear with respect to the edge length, then the edge has weight which is the slope of the cost function.

The compactor solves the constraint graph to minimize the longest path in a conventional manner. The resulting IC now has a minimum area, but without any optimization of yield or other performance criteria.

Each of the performance criteria cost models describes a performance criteria for the IC, such as defect probabilities for yield, power consumption, cross-talk delay, and the like. The cost models describe their various criteria using one or more convex cost functions, each of which is a function of the spacing between layout objects.

For optimization of yield using a fixed size, or any number of other performance criteria, a sink to source edge is added to the minimized constraint graph, with a length equal to the minimized overall size of the graph, as determined by the compactor.

The cost function module then traverses the constraint graph and applies to each of the edges therein one or more of the cost functions for selected performance criteria. Each cost function estimates the cost imposed on the two layout objects given their distance from one another in the layout. If there are multiple performance criteria, the cost functions are summed to produce a weighted sum of the cost functions. Likewise, where a vertex representing a cell instance comprises multiple circuit elements, cost functions for each of the circuit elements may be determined and combined. As the of sum of convex functions is convex, the result in either case is a single, convex cost function for the edge between two layout objects. Because the cost functions on the edges are non-linear, convex functions, the constraint graph cannot be minimized by conventional network flow algorithms.

Accordingly, the present invention transforms the edge cost functions into a form that can be solved in this manner. In one embodiment of the present invention, the piecewise linear cost function module traverses the constraint graph and converts the cost function attached to the edge into a convex piecewise linear cost function that approximates the cost function. This piecewise linear cost function has a number of segments, each with a constant slope, and covering a range of distances between layout objects. The slope of each segment of the piecewise linear cost function indicates a linear cost function imposed on the layout objects by the performance criteria in the range of distances covered by the segment.

In one embodiment of the system, the constraint graph is expanded by converting in each edge between two vertices (a fanin vertex and a fanout vertex), the resulting piecewise linear cost function and segments into a subgraph. This subgraph has additional vertices, called implicit vertices, which correspond to the transitions between the segments. The fanout and fanin vertices are the source and sink vertices of the subgraph, respectively. The implicit vertices are coupled by forward edges and backward edges. These edges have linear cost functions, and hence defined weights. Specifically, the forward edges are weighted by the slopes of their respective segments, hence the slope of the piecewise linear cost function. The backward edges have zero weight, but have a length representative of the distance between the segment transitions.

Now, because the edges in the expanded constraint graph have linear cost functions, the constraint graph may be minimized using a network flow algorithm, such as a wire length minimization algorithm. The network flow algorithm determines the positions of all the vertices in the constraint graph that minimize the total cost of the edges of the expanded constraint graph by moving the various vertices toward and away from each other. Minimizing the cost of the expanded edges minimizes the piecewise linear cost function for the original, unexpanded edges. This optimizes the convex cost functions of the selected performance criteria, such as yield.

The layout of the integrated circuit in the layout database is updated with the new information about the positions of the layout objects represented by the vertices in the constraint graph. The layout is now optimized for yield (or other performance criteria) in the first compaction direction. The process is now repeated in a second compaction direction of the integrated circuit. The integrated circuit may now be manufactured, with a maximum yield for the fixed size of the integrated circuit.

To optimize the number of good integrated circuits per wafer, this process may be repeated by replacing the original sink to source edge with a source to sink edge to the constraint graph that has a zero length, and a weight equal to the ratio of total cost of the constraint graph, as determined above, to the minimized overall size of the layout.

In another aspect, the present invention is a software application that provides a software product including a cost function module that attaches performance criteria cost functions to a constraint graph, a piecewise linear cost function module that converts the performance criteria cost functions to a single convex piecewise linear cost function. A graph expansion module may be used to expand the subgraphs within the constraint graph. A conventional wire length minimization algorithm is then provided in the software product to solve the underlying network flow problem of the constraint graph.

Another aspect of the present invention provides a computer aided design apparatus that optimizes multiple performance criteria of a system, where each performance criteria has one or more convex cost functions. The computer aided design apparatus uses a structural description of the system that includes objects having binary relationships (object to object). Binary relationships include the distance between adjacent objects, and other quantitative relationships. The convex cost functions are based on the quantitative values of the binary relationships between the objects. The structural description is converted to a constraint graph, and then performance criteria cost functions are attached to the constraint graph. These cost functions are converted to convex piecewise linear cost functions. The constraint graph with the piecewise linear cost functions is then minimized to produce a constraint graph to define new locations for objects in the system. From the minimized constraint graph a revised structural description of the system may be extracted, one that optimizes the selected performance criteria.

DETAILED DESCRIPTION OF THE INVENTION

Figure 1:
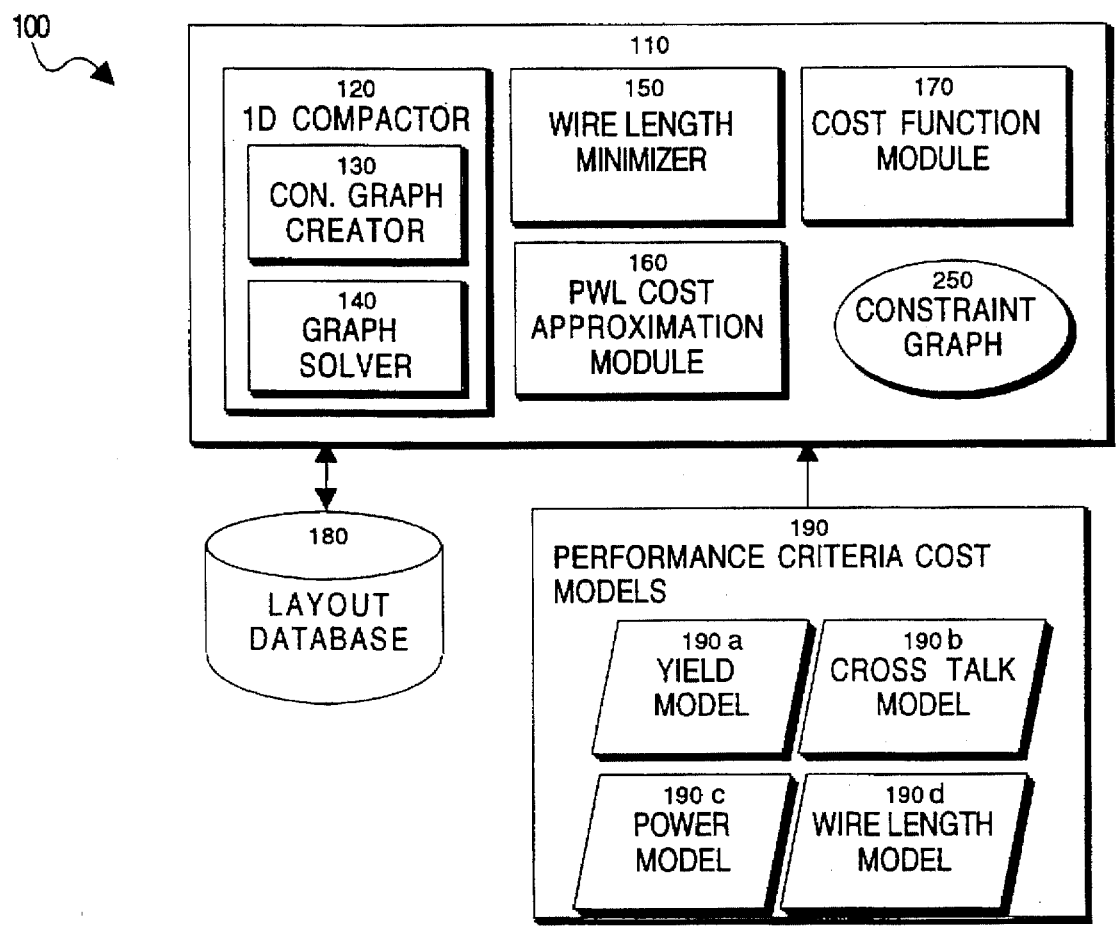
FIG. 1 is an illustration of a system for optimizing fabrication yield in accordance with one embodiment of the present invention.

Referring now to FIG. 1, there is shown an illustration of a computer aided design system 100 in accordance with one embodiment of the present invention. The system 100 operates on a conventional computer 110, having conventional memory, processor, and operating system. Within the memory of the computer 110 there are provided various executable software modules that configure and control the computer 110 in accordance with the present invention. These software modules include a 1D compactor 120, a wire length minimizer 150, a cost function module 170, and a piecewise linear cost function module 160.

Coupled to the computer 110 through conventional interfaces is a layout database 180. The layout database 180 includes a symbolic structural description of an integrated circuit. The structural description is comprised of layout objects, or cells, including symbolic blocks and symbolic wires. Blocks are coupled to wires by pins. The insides of the blocks need not be in symbolic format, and can be polygonal format. Over the cell routing of wires is permissible, as is yield interaction between cells. The layout objects have (X,Y) coordinates, which are updated following compaction and minimization. The layout database 180 may provide the structural description of the integrated circuit in Cadence DFII format, including New Block Ensemble (NBE) format, Cell Ensemble, Cell3, LAS compacted data, or any customer defined symbolic formats.

More particularly, the structural description for layout objects includes at least the following. A pin is represented by its (x,y) coordinates, and a fixed width/height, and one or more objects that couple to the pin. A wire is represented by the (x,y) coordinates of its end points, and its width. A wire may be terminated at either a pin or another wire. A block is represented by the coordinates of its lower left corner (the other corners may be actual or derived), a list of one or more pins, and a list of the objects within the block. Other technology specific data may also be included.

The compactor 120 includes a graph solver 140 and a constraint graph creator 130. The constraint graph creator 130 reads a structural description of an integrated circuit from the layout database 180 and creates a constraint graph 250. The constraint graph 250 may be created using conventional techniques, such as described in by D. Hill, et al., *Algorithms and Techniques for VLSI Layout Synthesis*, p. 66–68, Kluwer Academic Publishers (1989).

The graph solver 140 is used to compact the constraint graph, and thereby produce a dimensionally minimized layout of the integrated circuit. The compactor 120 is a one dimensional compactor, so compaction is performed in both the X and Y axes, one at a time. Suitable compactors 120 include Cadence Design System's Virtuoso™ compactor.

The wire length minimizer 150 analyses the constraint graph 250 to produce a minimized constraint graph. The wire length minimizer 150 is one instance of software that implements a network flow algorithm. Other network flow algorithms may also be used. A suitable wire length minimizer 150 is described in R. Varadarajan and G. Lakhani, *A Wire Length Minimization Algorithm For Circuit Layout Compaction*, Proc. IEEE Int. Symposium on Circuits and Systems, 1987. In one preferred embodiment, the wire length minimizer 150 is improved by modifying it to solve a constraint graph 250 that has been extended to support piecewise linear cost functions. Both a standard and improved wire length minimizer 150 is further described below.

Further coupled to the computer 110 is a set of performance criteria cost models 190. These cost models 190 describe various performance attributes of an integrated circuit that may be measured as a function of the spacing between layout objects, wire lengths, and other dimensional characteristics. A primary characteristic of the performance criteria cost models 190 is that they are convex cost functions. The performance criteria cost models 190 may include a yield model 190a, a cross-talk model 190b, a power consumption model 190c, and a wire length model 190d. Each cost model 190 includes at least one, and likely several, cost functions.

The yield model 190a describes circuit yield due to spot defects. The yield model 190a includes a number of convex yield cost functions. Generally, these yield cost functions are based on the defect size x, the distribution of which may be modeled using the following expression:

$$D(x) = \frac{X_0}{x^3} \qquad \text{Eq. 1}$$

where $X_0$ is a process-dependent constant. Eq. 1 is described in C. H. Stapper and R. J. Rosner, *Integrated Circuit Yield Management and Yield Analysis: Development and Implementation*, IEEE Trans. on Semiconductor Manufacturing, vol. 8, n. 2, pp. 95–102, May 1995.

Figure 3:
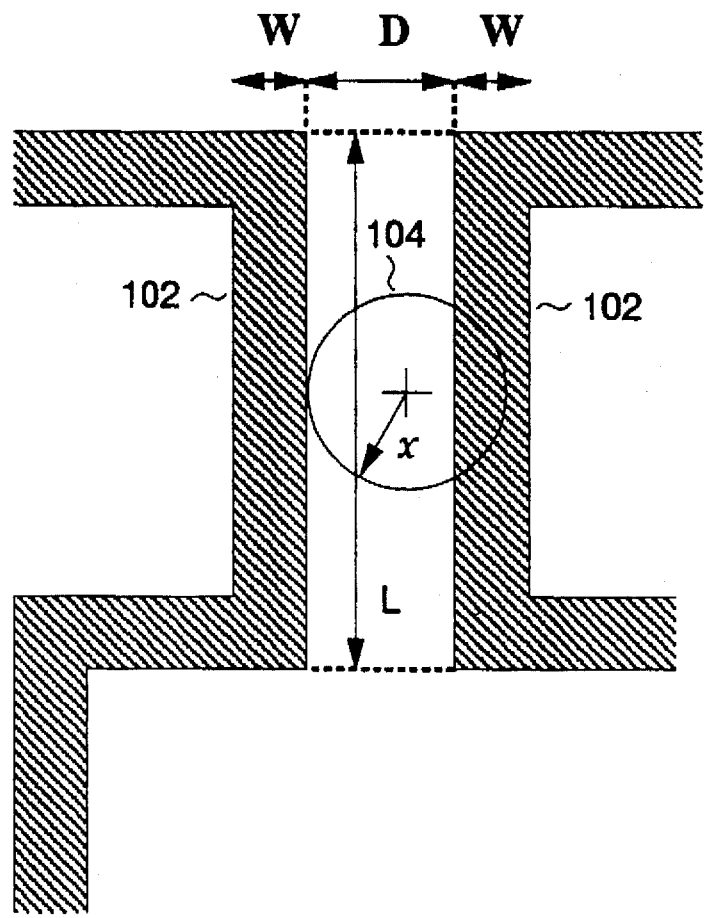
FIG. 3 is an illustration of a bridging fault type OE between circuit elements.

FIG. 3 illustrates a fault due to a spot defect 104 of radius x bridging two parallel wire segments 102 on the same layer, thereby short circuiting the wires. The wire segments 102 have width W and are separated by a distance D. The wire segments 102 face each other for a length L. This type of a spot defect 104 is called an OE (One-layer Extra-material defect), using the notation introduced in E. P. Huijbregts, H. Xue, J. A. B. Jess, *Routing for Reliable Manufacturing*, IEEE Tran. on Semiconductor Manufacturing, vol. 8, n. 2, pp. 188–194, May 1995.

Figure 4:
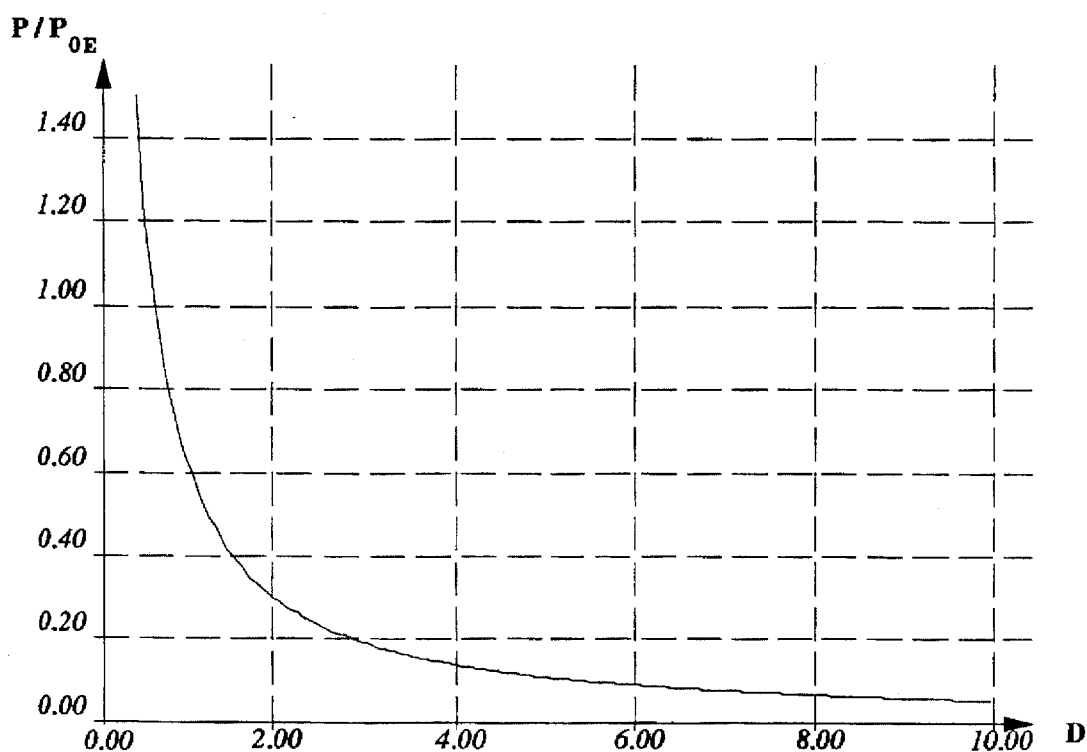
FIG. 4 is a plot of the probability of a bridging fault type OE.

FIG. 4 illustrates a probability of failure due to spot defects of type OE as a function of the distance D between circuit elements.

The yield cost model 190a includes a model on the probability of a fault of type OE between two parallel wire segments at a distance D from each other:

$$P = P_{OE} X_0 \left( \frac{1}{D} - \frac{1}{2D+W} \right) \qquad \text{Eq. 2}$$

where W is the average of the widths of the two segments. The constant $P_{OE}$ is proportional to the length L of the parallel portion of the two wire segments 102. FIG. 4 is a plot of the fault probability function P. The yield cost model 190a would include a cost function P for each of the fault types of interest. Other fault types for which cost functions may be provided including open circuit faults.

From Eq. 2, it is clear that yield increases when the distance D between any pair of parallel wire segments in the circuit is increased. For a pair of parallel wire segments on a same layer separated by distance D, there is a cost equal to the probability of failure due to a type OE spot defect for that distance. The cost function C is:

$$C(a \rightarrow b) = P_{OE} X_0 \cdot \left( \frac{1}{D} - \frac{1}{2D+W} \right) \qquad \text{Eq. 3}$$

The cost function C in Eq. 3 is expressed in terms of the length dλ of an edge (A→B) in a constraint graph, which is equal to D plus some constant offset (typically wire width W). The cost function in Eq. 3 is a convex function of dλ, therefore a reasonable piecewise lineary approximation with monotonically increasing slope may be determined.

As will be described below, a cost function model 190 is approximated by the piecewise linear cost function module 160 with a piecewise linear cost function F(d) with $N_s$ transitions $x_1, \ldots, x_{N_s}$... and N-1 segments. The number $N_s$ of transitions, their coordinates and the values of F(d) at those transitions are chosen to maintain the difference between the slopes of the cost function model 190 and the piecewise linear cost function F(d) within an arbitrarily small predetermined value. For most practical cases good approximations are obtained with three to five segments in the piecewise linear cost function. The minimization of the piecewise linear cost function of a yield cost model 190a is equivalent to maximizing yield in the presence of spot defects. This process of minimizing the piecewise linear cost function is described further below.

The power consumption model 190c describes power consumption due to capacitance between neighboring wires, again as function of wire separation distance. Similarly, the cross-talk model 190e describes cross-talk due to capacitance between neighboring wires. The power consumption model 190c and the cross-talk model 190e may be derived from *An Analytical Model Generator for Interconnect Capacitances*, Umakanta Choudhury, Alberto Sangiovanni-Vincentelli, IEEE Custom Integrated Circuit Conf. (1991).

The wire length model 190d describes the length of wires needed route the circuit. A suitable wire length model 190d is described in C. Bamji, and E. Malavasi, *Enhanced Network Flow Algorithm for Yield Optimization*, 33rd Design Automation Conference, Las Vegas Nevada, June 1996.

Other performance criteria cost models 190 may also be used, provided they are convex cost functions.

In a preferred embodiment, the cost functions in the cost models 190 developed from the underlying model distribution data are provided in the form:

$$C(L,d) = L\alpha e^{-\beta d} \quad \text{Eq. 4}$$

where L is the length for which two layout objects face each other, α and β are technological constants, and d is the spacing between the two layout objects. When modelled in this fashion, each of the performance criteria cost functions in a cost model 190 may be easily stored as specific values for L, α, β, and d. The cost function module 170 substitutes these values into Eq. 4 and determines the particular cost function C(d) for a pair of layout objects. Values of α and β may be determined such that Eq. 4 is a reasonable approximation of many convex cost functions appliable to yield and other performance criteria. The form of Eq. 4 further facilitates the combination of multiple cost functions from diverse performance criteria cost models, thereby enabling multiple performance criteria to be optimized simultaneously.

The system 100 further includes a cost function module 170 that takes a performance criteria cost model 190 and applies the cost functions C therein to each of the edges in the constraint graph 250 for a layout. This means that cost function module 170 parameterizes the cost function C of an edge (the edge length representing a distance d between adjacent layout objects) by the length L for which the two layout objects face each other, and the technological constants α and β. The result is a particularized instantiation of the cost function for the two layout objects.

Where there are multiple cost functions C applicable to an edge, either from one or more performance criteria cost models 190, the cost function module 170 combines the individual cost functions C to produce a single, convex cost function.

Separately, a piecewise linear cost function module 160 converts the cost function attached to each of the edges of the constraint graph 250 to a convex piecewise linear cost function. The wire length minimizer 150 then minimizes the constraint graph in this form.

Figure 2:
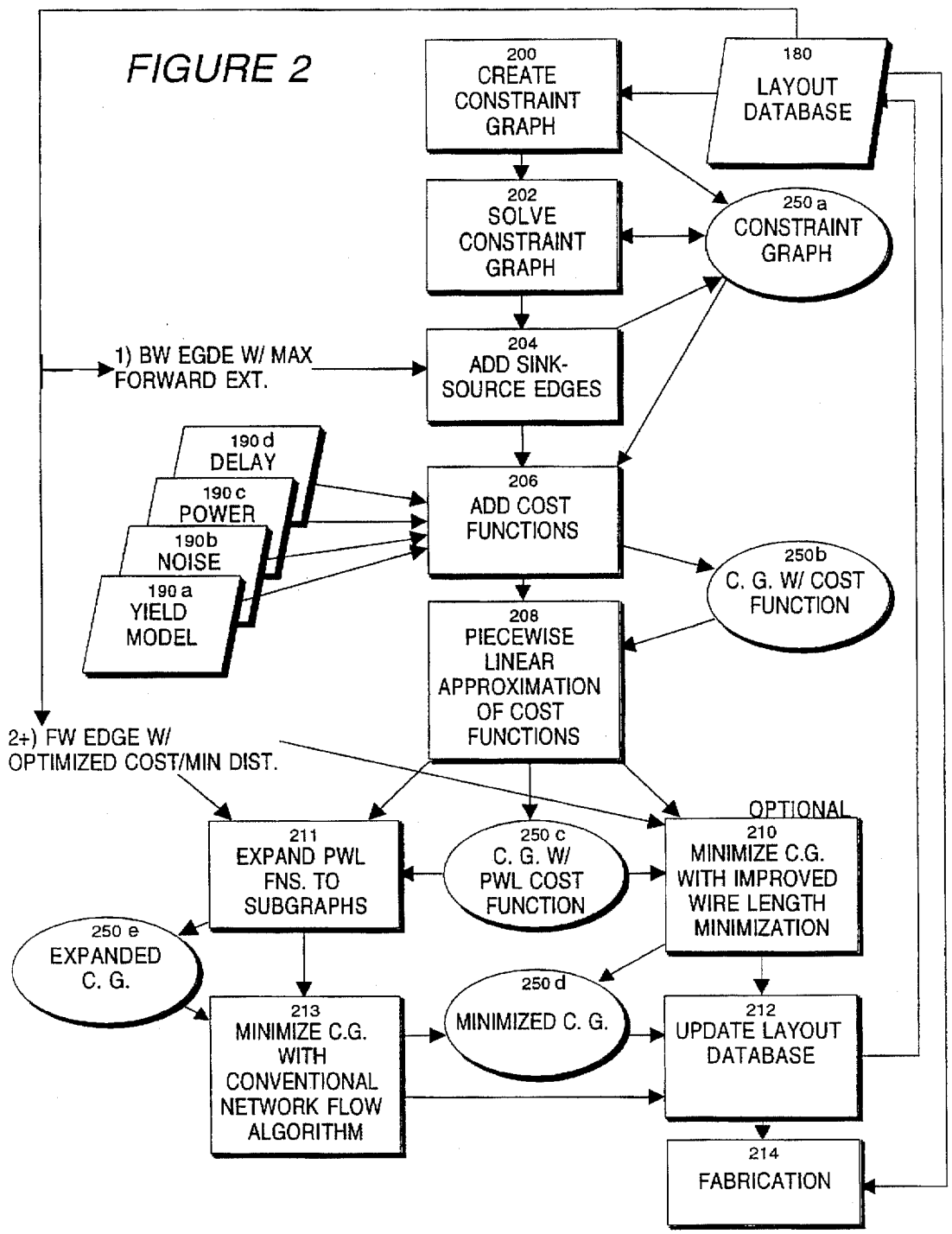
FIG. 2 is a dataflow diagram of the method of optimizing performance criteria for an integrated circuit according to one embodiment of the present invention.

Referring now to FIG. 2, there is shown a flowgraph of a method in accordance with the present invention. From the structural description of the integrated circuit in the layout database 180, the constraint graph creator 130 creates 200 a constraint graph 250a.

The constraint graph 250a comprises a plurality of vertices and edges. Vertices represent layout objects, blocks, wires, and pins in the structural description of the integrated circuit in the layout database 180. Objects in the layout that are adjacent in the compaction direction give rise to an edge between the vertices representing the objects.

Figure 5A:
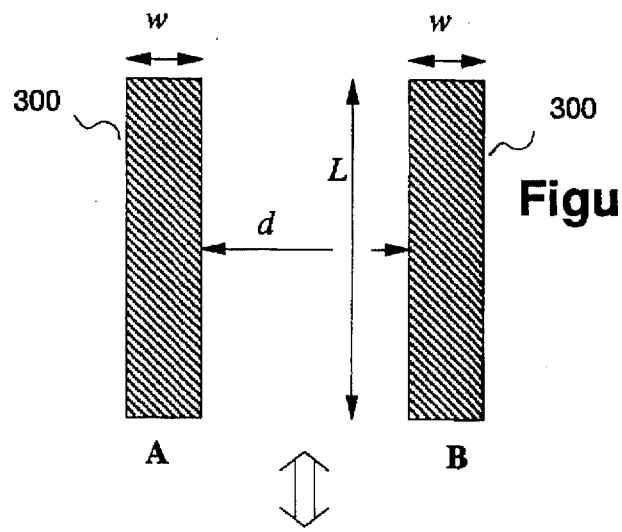
FIG. 5a is an illustration of two objects in a layout.
Figure 5B:
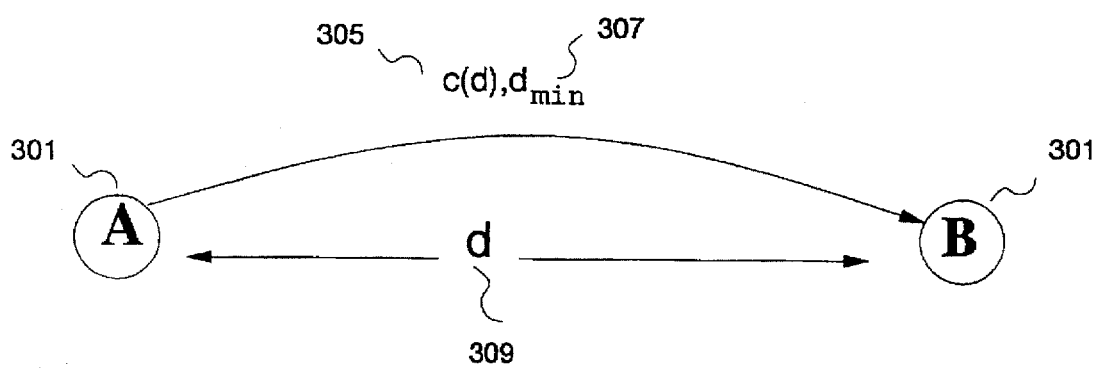
FIG. 5b is a illustration of two vertices of a constraint graph for these objects, showing the notation used herein.

FIG. 5a illustrates two layout objects 300, A and B each with a specified width w, and facing each other for a length L. The objects 300 are separated by distance D. FIG. 5b illustrates a constraint graph 250 for these objects, with vertices 301 for each object, and an edge 303 coupling the vertices 301.

The edge 303 has a cost function C, and a length constraint $D_{min}$. The length constraint $D_{min}$ corresponds to the minimum separation distance between the layout objects A and B, as determined by the layout design rules. The cost function C is a function of the separation distance D between the layout objects A and B, according the cost function variables L, α, and β. Where there are multiple cost functions $C_i$ the cost function C is derived from L, and $\alpha_i$ and $\beta_i$.

An edge 303 has a length 309 that is determined from the positions of the layout objects 300, and any applicable offsets.

An edge 303 is directed. The source of an edge 303 is the fanout vertex, and the sink of an edge 303 is the fanin vertex. In FIG. 5b, vertex A is the fanout vertex and vertex B is the fanin vertex. From the perspective of a vertex 301, the incoming edges 303 are fanin edges, and the going edges are fanout edges. While only one edge 303 is shown for each vertex 301, a vertex 301 may have any number of fanin or fanout edges.

Each vertex 301 has also has weight which is:

$$\text{vertex.weight} = \Sigma(\text{fanin\_edge}_i.\text{weight}) - \Sigma(\text{fanout\_edge}_j.\text{weight}) \quad \text{Eq. 5}$$

for all fanin edges i and fanout edges j of a vertex 301.

Formally, H(E,V) is a constraint graph 250, where E is the edge set, and V is the vertex set. A directed edge 303 from vertex A to vertex B is denoted (A→B). The edge length is the difference between the location of vertex B and that of vertex A and is denoted l(A→B), and need not be stored in the edge itself, but rather is preferably computed from the locations of the vertices. Each edge (A→B) in the constraint graph 250 has a minimum length denoted by $D_{min}$ (A→B). A cost of edge (A→B), denoted C(A→B), is determined by one or more cost function $C_i$ each of which depends on the values of $L_i$, $\alpha_i$, and $\beta_i$. The cost of the constraint graph 250 is the sum of all the edge costs. If the edge cost C(A→B) is proportional to the edge length, the slope of the cost function C is a constant called "edge weight", and is denoted by w(A→B)=c(A→B)/l(A→B). The location of vertex v is denoted l(v). The constraint graph is assumed to have a single source $v_L$ and a single sink $v_R$.

Table 1, provides a preferred object definition of the edges 303 in the constraint graph 250a, including the additional elements in support of improved wire length minimizer 150.

TABLE 1

Edge Object Model

Edge Associations

| | |
|---|---|
| Fanin Vertex | Identifies the vertex that is the source of the edge. |
| Fanout Vertex | Identifies the vertex that is the sink of the edge. |

Edge Attributes

| | |
|---|---|
| Cost Function Variables: | L: the length for which the fanin vertex object faces the fanout vertex object. |
| L, [$\alpha_1$, $\beta_1$] | [$\alpha_1$, $\beta_1$]: Set of technological constants received from the cost model, each set specifying constant values for a single cost function $C_i$. |

Table 2 specifies the object definition for vertices 301.

TABLE 2

Vertex Object Model

Vertex Associations

| | |
|---|---|
| List of Fanout Edges | List of edges for which the vertex is the fanout vertex. |
| List of Fanin Edges | List of edges for which the vertex is the fanin vertex. |

Vertex Attributes

| | |
|---|---|
| Weight | The weight for the vertex. |
| Layout object | Identifies object in the layout database 180 that corresponds to the vertex. |
| Location | Specifies the absolute location of the object in the coordinate system of the layout. |

Referring again to FIG. 2, the graph solver 140 solves 202, or compacts, the constraint graph 250$a$, determining the minimum dimension $L_c$ for the layout in the direction that was determined when the constraint graph 250 was created.

Figure 6:
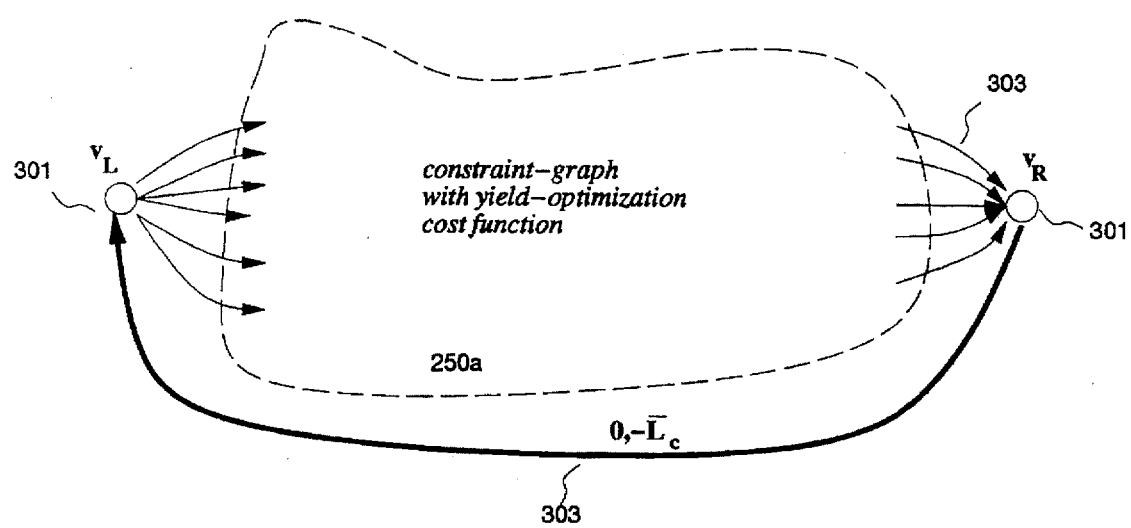
FIG. 6 is an illustration of the constraint graph with a sink to source edge added to produce maximum yield, with a fixed area.

In the first pass through the optimization process, the constraint graph creator 130 then modifies constraint graph 250$a$ by adding 204 an additional edge 303 between the sink vertex $v_R$ and the source vertex $v_L$ of the constraint graph 250. FIG. 6 illustrates the constraint graph 250$a$ of an arbitrary layout with this additional edge 303. The new edge 303 is given as its length constraint 307 the value $-L_c$. This maintains the compacted layout at its minimized size, thereby ensuring that the overall size of the layout is fixed when the performance criteria are subsequently optimized, for example; to increase yield. The cost function 305 is set to 0.

The cost function module 170 adds one or more of the cost function models 190, as selected by the circuit designer, to the constraint graph 250$a$. The designer may chose to optimize only yield, in which case only the yield model 190$a$ need be used. Multiple cost models 190 may be selected with the cost function module 170.

The cost function module 170 traverses the constraint graph 250, and for each edge 303 therein, stores 206 in the data structure of the edge 303 a cost function C derived from the cost function model(s) 190.

More particularly, as noted above, a cost function C preferably takes the form of:

$$C(L,d) = L\alpha e^{-\beta d} \qquad \text{Eq. 4}$$

The values of L and d are distinct for each combination of layout objects. In particular, in a given compaction direction, L is fixed, while d, the distance between the layout objects, is the value that is to be optimized with respect to one or more cost functions. Accordingly, to store the cost function C for each edge 303, the cost function module 170 determines the values of L, $\alpha$, and $\beta$. For cases where there is only one cost function C, these values are determined directly.

The resulting cost function C can always be placed in the form:

$$C(d) = \alpha' e^{-\beta d} \qquad \text{Eq. 7}$$

where $\alpha'$ is determined from L, technological constant $\alpha$, and any required offsets to d. In this form, there is only a single technological constant $\beta$. From this form, a weighted sum of such cost functions C may be expressed as a new function of exactly the same form.

There are three types of complex cases having multiple cost functions where this combination of cost functions arises.

1. Multiple performance criteria models 190 may be selected, each with specific cost functions C. Each cost function is expressed in the form of Eq. 6, and then combined. In this case, L is fixed since there is only a single pair of objects. This is the case for optimizing multiple performance criteria at one time.

2. A single performance criteria is selected, and applied to vertices representing blocks, each block having groups of objects facing objects in the other block. Here, there will be various individual values of L for each pair of facing objects in the two blocks. Again, the specific object pairs are given cost function C with their particular values of $L_i$, and $\alpha$ and then the cost functions combined into a single cost function.

3. Multiple performance criteria models 190 are selected, and applied to vertices representing blocks, as in case 2. Here, there are both distinct values of $L_i$ and $\alpha_i$ which are combined into a single cost function C.

Generally, the combination of cost functions is done as follows.

If there are T total cost functions, and R total objects for a vertex, then for object and cost function is there a cost component $C_{i,j}$ equal to:

$$C_{ij,T} = L_{ij,T} \alpha_{ij,T} e^{-(\beta_{ij,T} d_{ij,T})} \qquad \text{Eq. 8}$$

where ij is a pair of objects, and T indexes the cost functions. Eq. 7 is equal to:

$$C_{ij,T} = L_{ij,T} \alpha_{ij,T} e^{-(\beta_{ij,T}(d + \text{offset}_{ij,T}))} \qquad \text{Eq. 9}$$

Eq. 8 can always be rewritten as:

$$C_{ij,T} = \alpha'_{ij,T} e^{-(\beta_{ij,T} d)} \qquad \text{Eq. 10}$$

Hence, $$C_m = \Sigma \alpha'_{ij,T} e^{-(\beta_{ij,T} d)} \qquad \text{Eq. 11}$$

for all values of i and j.

If it is assumed that $B_{ij} = B$ for all values of i and j (a reasonable assumption for most technology libraries), then:

$$C_m = \alpha' e^{-(\beta d)} \qquad \text{Eq. 12}$$

where $$\alpha' = \Sigma \alpha'_{ij,T} \qquad \text{Eq. 13}$$

Eq. 11 is the same as Eq. 6, which is the basic form of the cost functions used herein.

The resulting cost function $C_M$ represents the combined cost functions $C_{ij,T}$. For case 1) above, all $L_i$ are equal to L, the distance between the layout objects, and each $\alpha_i$ varies. For case 2) there are multiple values of L, and a single value of $\alpha$, since there is only one cost function being applied. For case 3) above, there are multiple values of both L and $\alpha$.

The coefficients $\alpha'$ and $\beta$ of this cost function $C_M$ are then stored in the edge 303 by the cost function module 170, and are used by the piecewise linear cost function module 160 to determine the piecewise linear cost function for the cost function $C_M$.

Referring again to FIG. 2, the result of the cost function module 170 is the constraint graph 250b with cost functions. At this point, the constraint graph 250b cannot be minimized by conventional network flow algorithms. This is because conventional network flow algorithms require that the edge weights be linear cost functions. Here, the cost functions C are convex. Accordingly, it is necessary to transform the convex cost functions that have been attached to each of the edges 303 to a form that the may be used with conventional network flow algorithms. This is done as follows:

The piecewise linear cost function module 160 is called to process the constraint graph 250b, so that the convex cost function 305 of the edges 303 is approximated as a piecewise linear convex function. To do this, the piecewise linear cost function module 160 traverses each of the edges 303 in the constraint graph 250b. For each edge 303, the piecewise linear cost function module 160 converts the cost function associated with the edge 303 into a piecewise linear cost function that best approximates the cost function. This conversion is illustrated in with respect to FIG. 7.

Figure 7:
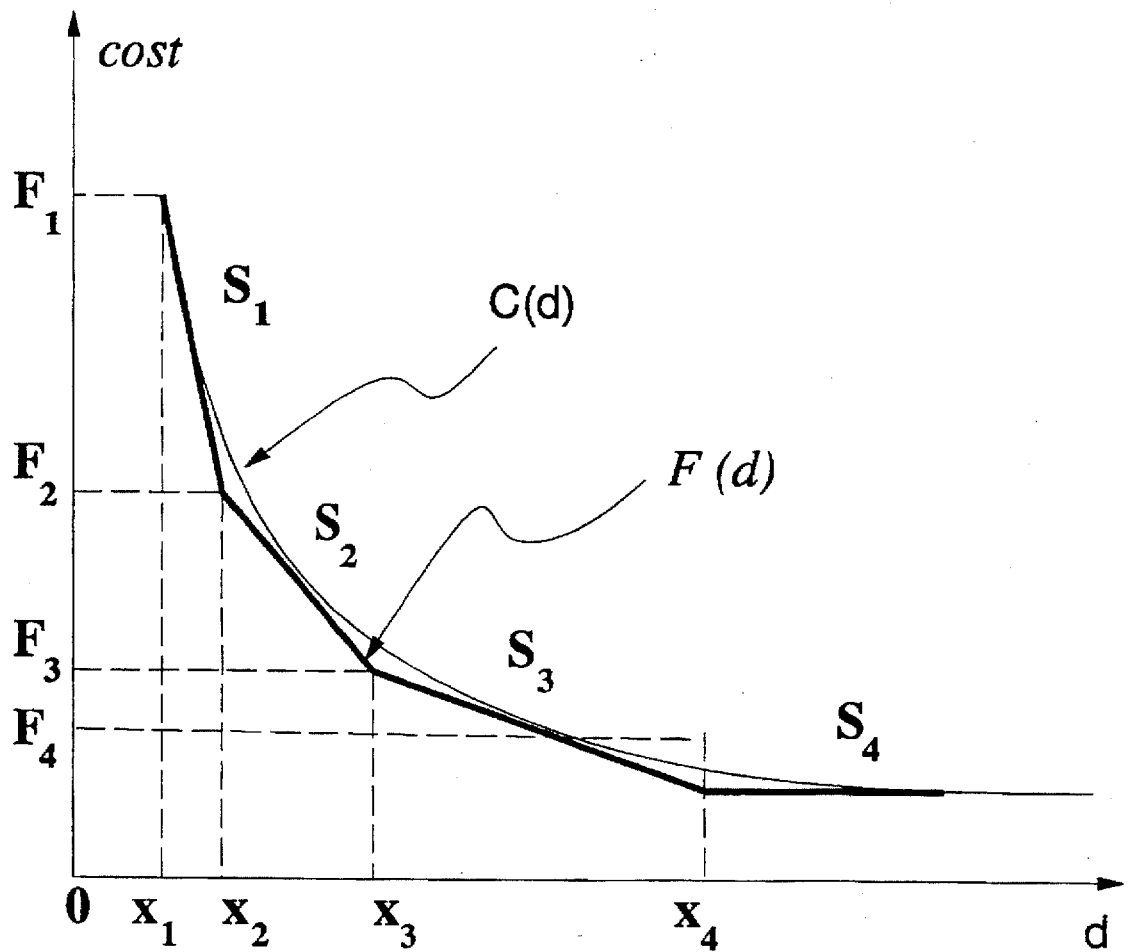
FIG. 7 is an illustration of cost function for a general performance criteria, along with a piecewise linear cost approximation for the cost function.

Referring to FIG. 7, there is shown an illustration of a performance criteria cost function C. This Cost function C is convex with respect to edge length, or the distance between two layout objects. That is, each coordinate $x_i$ represents a specific length of the edge 303, and hence distance between the layout objects represented by the vertices 301 coupled to the edge. Thus, at each distance $d=x_i$ between the objects, there is cost $C(x_i)$ imposed on the layout objects. For such a cost function C, the piecewise linear cost function module 160 determines a corresponding piecewise linear cost function F.

Referring now to FIG. 7, the piecewise linear cost function F may be created generally as follows. It is assumed for explanatory ease that N, the number of segments, is set to 4 for the function F.

i) Create an asymptote for cost function $C_M$ for $x=+\infty$ (or near the end of the region of interest). It should be noted that there may be some convex functions such as $x^2$ that do not have an asymptote at $+\infty$. In this case, other heuristic techniques are used to provide an approximation of the function.

ii) Starting from $x_i=+\text{infinity}$, when the slope $S_i$ or value of the asymptote deviate from the slope or value of C by more than a preset threshold, mark that coordinate $(x_4, F_4)$.

iii) Take the tangent of the curve $C_M$ going though $(x_4, F_4)$.

iv) Continuing from $(x_4, F_4)$, where this tangent deviates from the slope $S_i$ or value of function C by preset threshold, mark this coordinate $(x_3, F_3)$.

v) Repeat the process of taking a tangent to the curve to find points $(x_2, F_2)$, and $(x_1, F_1)$ vi) Stop the process when the minimum distance between vertices A and B has been reached at $x_1$.

This linearization method ensures that:

$$\Delta C = |C - F| \qquad \text{Eq. 14}$$

is the error between the piecewise linear cost function F and the original cost function C, and $$\Delta S = |C' - F'| \qquad \text{Eq. 15}$$

is the error between the slope of C and the slope of F over all segments, then the transitions $x_i$ and $F_i$ are selected to minimize the error $\Delta S$ and $\Delta C$ to less than predetermined arbitrary limits $\Delta S_{max}$ and $\Delta C_{max}$:

$$\Delta S \leq \Delta S_{max} \qquad \text{Eq. 16}$$

$$\Delta C \leq \Delta C_{max} \qquad \text{Eq. 17}$$

The smaller the value of $\Delta S_{max}$ the larger the value of N, and the more segments, and hence a closer approximation of the original cost function C by the piecewise linear cost function F.

The piecewise linear cost function F thus defines the cost imposed on the integrated circuit due the separation distance D, which is the length of the edge 303, between the layout objects represented by the vertices 301 coupled to the edge 303.

The slope of each segment $x_i$ and $x_{i+1}$ of C is constant, and is denoted as $S_i$. Because cost function C is convex, the slope of each $S_i$ is non-decreasing:

$$S_1 < S_2 < \ldots S_n \qquad \text{Eq. 18}$$

The piecewise linear cost function F is not defined for lengths of the edge 303 less than $x_1$. This is because $x_1$ represents the minimum separation distance $D_{min}$, between layout objects as determined by the design rules.

For separation distances D greater than $x_N$ the slope is $S_N$.

Accordingly, the slope of cost function F on an edge 303 that has a length D is the $S_n$ where $x_n < D < x_{n+1}$.

FIG. 7 also illustrates the piecewise linear cost function F for the cost function C. Here, there are four segments, with slopes $S_1$ to $S_4$ with $S_1$ being the slope for distances D between $x_1$ and $x_2$, $S_2$ being the slope for distances D between $x_2$ and $x_3$, and so forth. Notice that for all distances $D > x_4$, the slope is $S_4$. The piecewise linear cost function F of FIG. 7 approximates the cost function 190 shown in FIG. 4 accounting for the probability of faults due to spot defects.

Referring again to FIG. 2, when the piecewise linear cost function module 160 creates 208 the piecewise linear cost function for the edge, it takes the cost function variables L, $\alpha'$, and $\beta$, computes the value of the cost function $C_M$, using the form of Eq. 6, above. It then determines the corresponding N segment piecewise linear cost function F, and stores in the edge 303 the list of segment transitions x and slope S pairs.

The overall result is the constraint graph 250c with piecewise linear cost functions.

At this point, the constraint graph 250c may be minimized 210 in one of two ways. First, minimization of the constraint graph 250c may be done with a conventional network flow algorithm. This minimization requires expanding 211 the edges with piecewise linear cost functions with their equivalent subgraph and then minimizing 213 the constraint graph 250c using a conventional network flow algorithm, such as a wire length minimization. This approach provides the theoretical basis for the preferred implementation. This second, preferred approach directly minimizes 210 the constraint graph 250c with an improved version of a wire length minimization algorithm.

In order to apply a conventional network flow algorithm, the constraint graph 250b must be transformed into a constraint graph where the cost of each edge 303 is proportional to edge length 309 and hence a constant weight can be defined for each edge 303. This is achieved by substituting each edge 303 which has a piecewise linear cost function F with an equivalent sub-graph. All edges in this sub-graph have cost 305 proportional to length 309, and therefore have a well defined weight.

Figure 8A:
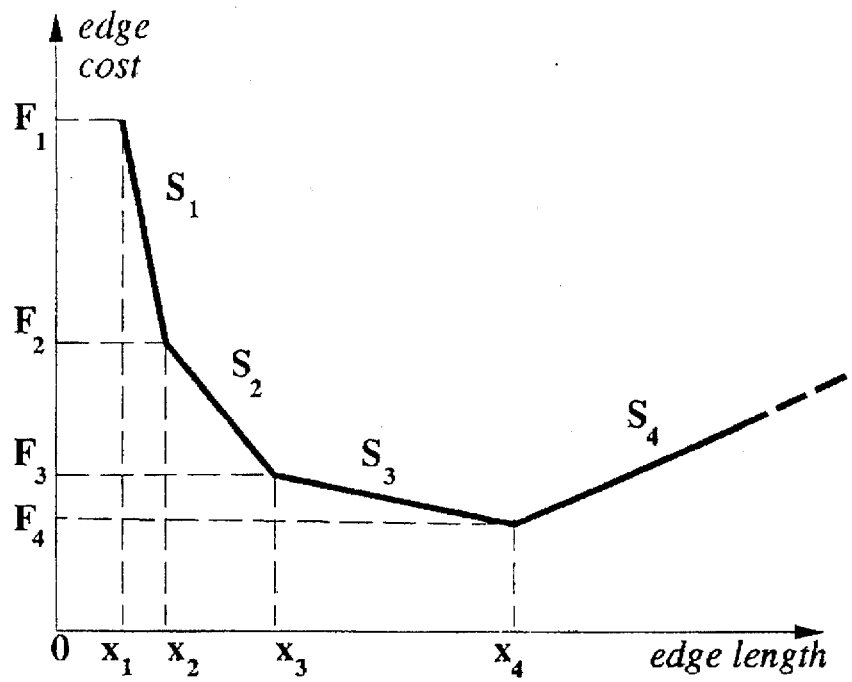
FIG. 8a is an illustration of a piecewise linear cost function and FIG. 8b is an illustration of a subgraph for this piecewise linear cost function.
Figure 8B:
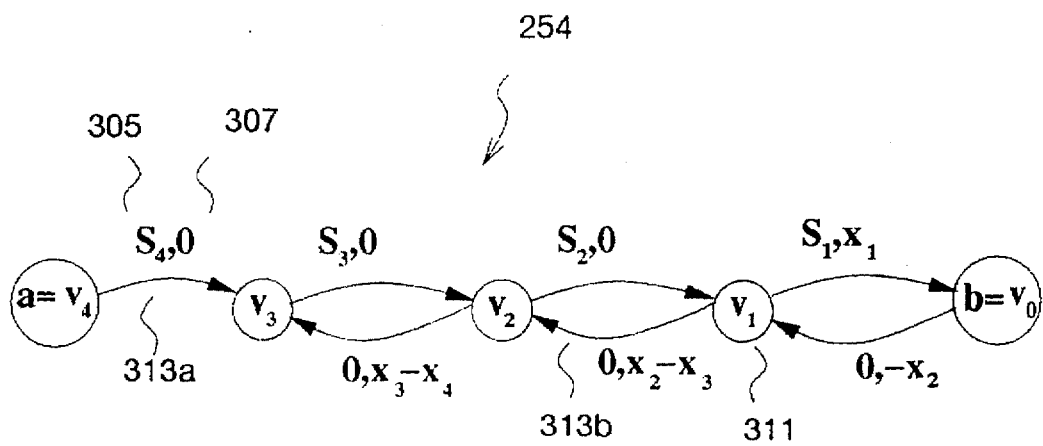

More particularly, every edge (A→B) (303) whose cost function is an $N_s$-segment piecewise linear cost function is replaced 211 by a sub-graph G(A→B) made of $(N_s-1)$ vertices $v_1, \ldots, v_{Ns}-1$, and $2N_s-1$ edges 313. FIG. 8a illustrates a piecewise linear cost function F, and FIG. 8b illustrates a subgraph 254 for this piecewise linear cost function. The fanout and fanin vertices A and B of edge (A→B) are renamed respectively $v_{Ns}$, and v. Vertices $v_1, \ldots, v_{Ns}-1$ are called implicit vertices 311 of sub-graph G(A→B).

Figure 8C:
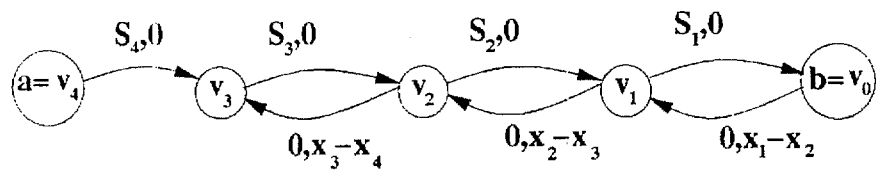
FIGS. 8c and 8e illustrate alternative constructions of the constraint graph.
Figure 8D:
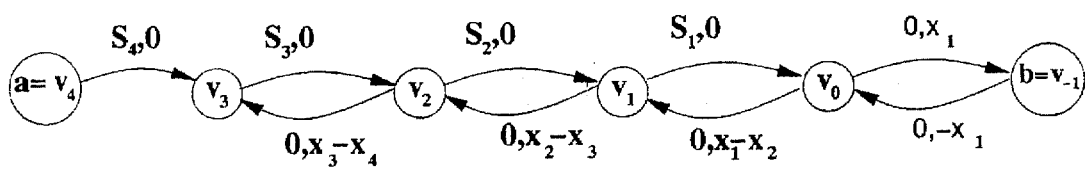
Figure 8E:
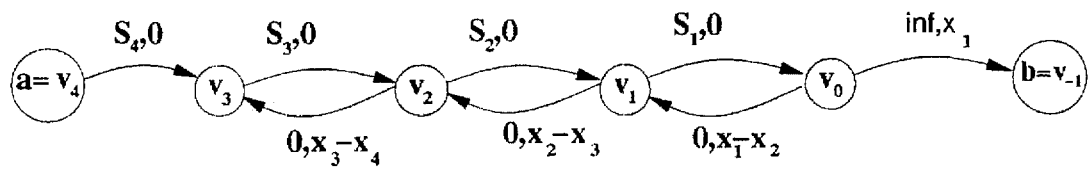

FIGS. 8d and 8e illustrate alternate constructions of the constraint graph 250 that are suitable for use with the present invention. FIG. 8c is useful for understanding how these alternate embodiments are derived. FIG. 8c is created from the subgraph of FIG. 8b, by making $x_1=0$.

If $x_1>0$ then basically the cost function of the graph is shifted by the value $x_1$, resulting in the constraint graph as shown in FIG. 8d. In other words, the piecewise linear cost function F should behave for $(x+x_1)$ the way it previously to behaved for (x). To accomplish this, in FIG. 8d an extra segment is added to the right of the subgraph. Original vertex B is now vertex $V_{(-1)}$ instead of vertex $V_0$. The extra segment has constraints such that location of $V_{(-1)}$=location of $V_0+x_1$. Note that the weights of the last two edges may be set at any value.

Another way of achieving the same effect is to make the subgraph as in FIG. 8e. The cost of the $V_0$ to $V_{(-1)}$ is set to +∞. Hence to minimize cost, that edge is always be kept as short as possible (i.e. edge length=edge constraint value) which again makes location of $V_{(-1)}$=location $V_0+x_1$.

It should be noted that it possible to create other variant constructions of the subgraphs by altering the order of the segments, for example by placing segments in order $S_2$, $S_4$, $S_3$, $S_1$. These reorderings and other variations all operate in essentially the same manner for the purposes of the present invention, and are within the scope of the inventive concept. Thus, the present invention is not limited to a particular ordering or weighting of the subgraphs, so long as the subgraph backward edges are weighted by the differences between segment slopes, and the forward edges are constrained by the slope values.

Figure 9A:
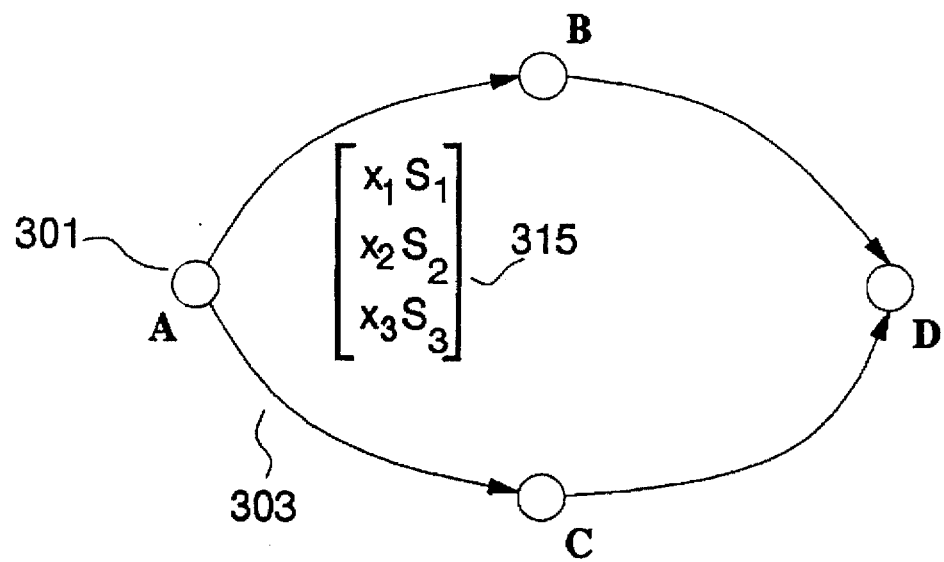
FIG. 9a is an illustration of a constraint graph.
Figure 9B:
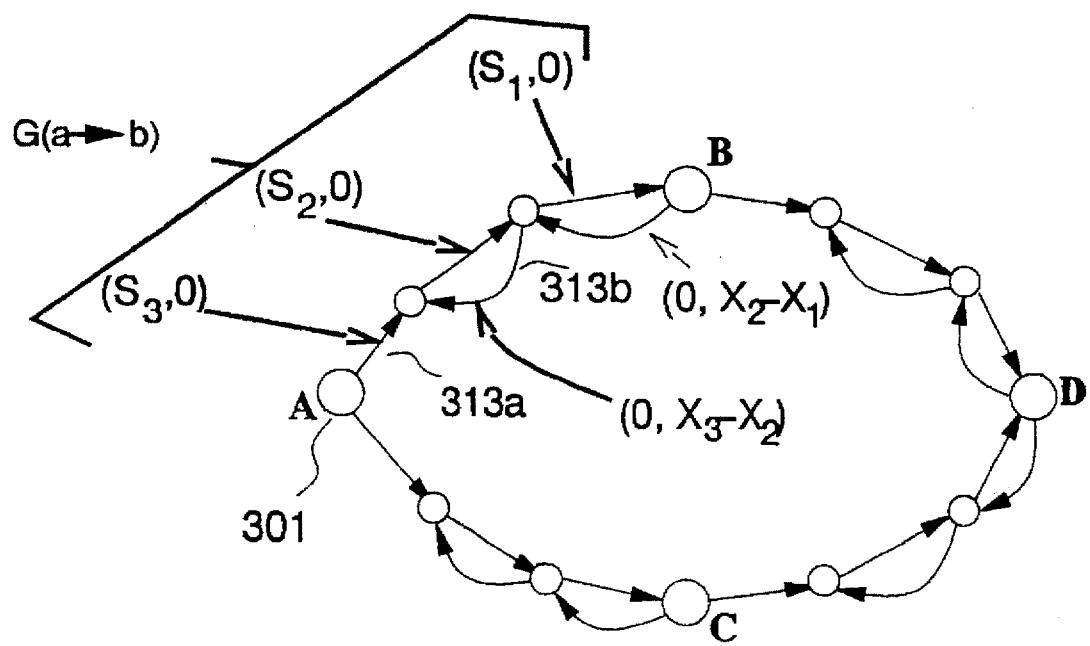
FIG. 9b is an illustration of a constraint graph with expanded implicit edges from the piecewise linear cost function.

FIG. 9a illustrates a simple constraint graph 250 with four vertices 301 coupled by edges 303. Each of the edges 303 has a piecewise linear cost function 315. FIG. 9b illustrates the constraint graph 254 resulting from the expansion of each edge 303 with an equivalent subgraph for the piecewise linear cost function 315. For example, the edge 303 between vertices A and B has a piecewise linear cost function 315 $[(x_1, S_1), (x_2, S_2), (x_3, S_3)]$. In FIG. 9b, this is expanded by three segment subgraph G(A→B) with two implicit vertices 311, and three forward edges 313a, each respectively with weight equal to respectively $S_3$, $S_2$, and $S_1$ and a constraint equal to 0, 0, and $x_1$. Backward edges 313b link vertex B and the implicit vertices 311 have 0 cost, but lengths 309 equal to the lengths of the segments, i.e. lengths 309 equal to $(x_{n+1}-x_n)$, except for the first backward edge, which as a length of $-x_2$.

The difference between the weights of the forward and backward edges (if present) between $v_i$ and $v_{i-1}$ is always equal to the slope $S_1$. More particularly, where a forward edge from $v_i$ to $v_{i-1}$ has a weight equal to $(S_i+k)$, where $S_1$ is the slope of a segment of the piecewise linear cost function starting at $x_1$ and k is an arbitrary number, then the corresponding backward edge from $v_{i-1}$ to $v_i$ has a weight of k. There are any number of subgraph definitions that satisfy this property. One embodiment of the subgraph G(A→B) which meets this constraint is defined as follows:

1. for each $i=1, \ldots, N_s$, there is a directed edge $(v_i \to v_{i-1})$, called forward edge 313a with weight 305 equal to the slope $S_i$, and constraint:

$$D_{min}(v_i \to v_{i-1}) = \begin{cases} 0 \text{ if } i > 1 \\ x_1 \text{ if } i = 1 \end{cases} \quad \text{Eq. 19}$$

2. for each $i=1, \ldots, N_s-1$, there is a directed edge $(v_{i-1} \to v_i)$ called backward edge 313b, with weight 0, and constraint:

$$D_{min}(v_{i-1} \to v_i) = \begin{cases} x_i - x_{i+1} \text{ if } i > 1 \\ -x_2 \text{ if } i = 1 \end{cases} \quad \text{Eq. 20}$$

Every forward edge 313a has a length $D_i$ (307) that is in one of three possible states:

Minimum Extension: Here, the length $D_i$ of the forward edge 313a is equal to the constraint:

$$D_i = l_{min}(v_i \to v_{i-1}) \quad \text{Eq. 21}$$

Maximum Extension: Here, the length $D_i$ of the forward edge 313a is equal to the module of the edge constraint of the backward edge 313b between the same vertices 311 that terminate the forward edge 313a:

$$D_i = |l_{min}(v_{i-1} \to v_i)| \quad \text{Eq. 22}$$

Active State: Here, the length $D_i$ of the forward edge 313a is between the two edge constraints of the forward edge 313a and the previous forward edges 313a:

$$l_{min}(v_i \to v_{i-1}) D_i < |l_{min}(v_{i-1} \to v_i)| \quad \text{Eq. 23}$$

The result of expanding 211 the constraint graph 250c is a constraint graph 250e that has a much larger number of vertices 301 and edges 303. However, the constraint graph 250e is amenable to minimization 213 using conventional network flow algorithms. One implementation of a network flow algorithm is the wire length minimization algorithm described in the Varadarajan reference, cited above.

As noted above, each vertex 301 has a cost function 305 that the sum of all weights 305 of fanin edges 303 entering the vertex 301 minus the sum of all the weights of fanout edges 303 leaving the vertex. The vertex weight is either negative, 0, or positive.

If the vertex weight is positive then it is advantageous to move the vertex as much to the "left" as possible (smallest vertex location value) so that the total edge cost is reduced. This means reducing the coordinate value of the vertex in the compaction direction. This is beneficial because the total weight of the edges whose length is increaed by moving the vertex is greater than the total weight of the edges whose length is reduced.

Similarly if the vertex weight is negative it is advantageous to move the vertex to the right (largest vertex value) as much as possible. This is because the weight of the edges whose length is reduced is greater than the total weight of the edges whose length is increased.

The conventional wire length minimization begins from a state in which each vertex 301 is in its leftmost position. This is the state of the constraint graph 250a following compaction 202 by the graph solver 140.

The constraint graph 250e is traversed, and each vertex 301, 311 with a negative weight is placed on a queue. Note that only vertices 301 from the original constraint graph 250 are queued; implicit vertices always have a positive weight and hence are never queued. For ease of notation, these vertices are referred to generally as "$V_n$", indexed by either i or j.

The wire length minimization algorithm then removes vertices $V_i$ from the queue until no more negative weight vertices 301 remain.

Each vertex $V_i$ with a negative weight is moved to the right until its "bumps" into another vertex $V_j$. That is, the coordinate location of the vertex on the axis of the compaction direction is increased until it is equal to the location of a vertex $V_j$ on one of its fanout edges 313. Moving the vertex $V_i$ in this manner reduces the fanout edge 313 to its minimum extension.

The vertex $V_i$ and $V_j$ are grouped together and now move as one object. This grouping is called a vertex cluster. The vertex cluster has a weight which is the total weight of all the vertices 301, 311 in the cluster. The weight of the vertex cluster is updated and if the weight is negative, the cluster is placed in the queue. The process then continues with the next vertex in the queue, until the queue is empty.

If the total weight of a vertex cluster is negative then it is advantageous to move the vertex cluster to the right as much as possible. The vertex cluster is thus moved to the right until it bumps into some other vertex or vertex cluster. This happens when a fanout edge from one of the vertices in the vertex cluster to a vertex not in the cluster reaches minimal extension. The algorithm terminates when all vertex clusters have positive weight.

When the cost of each subgraph is minimized, the subgraph has minimum configuration. In this case the cost of each subgraph is the cost of the corresponding piecewise linear function and the cost of the original (not expanded) constraint graph is minimized. Hence the optimal layout structure for minimizing the cost function has been determined. Referring to FIGS. 10a through 10f, the minimum configuration of a subgraph is produced by a conventional wire length minimization algorithm as follows.

Figure 10A:
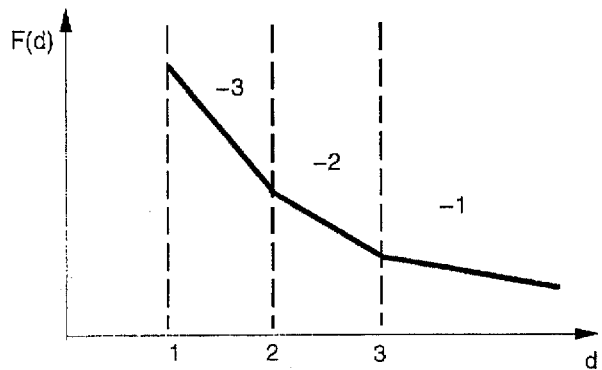
FIGS. 10a through 10e illustrate the process of placing a constraint graph in its minimum configuration.
Figure 10B:
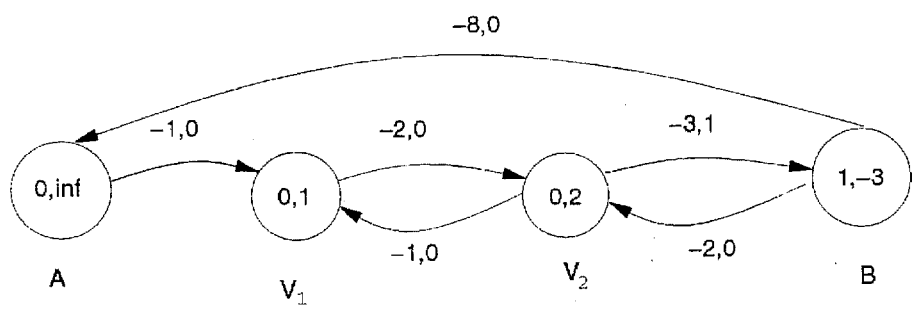

FIG. 10b illustrates a subgraph for the edge between vertices A and B, the subgraph having been produced from a piecewise linear cost function F. Cost function F having values of [(-3, 2), (3, -2), (4, -1)] is shown in FIG. 10a. The subgraph has implicit vertices $v_1$ and $v_2$. Shown inside the vertices are the vertex weights, which are equal to the difference between the summed fanin edge weights and fanout edge weights. Note that vertex A is given a weight of positive infinity. The edges are labeled with the weights and constraints as defined above for the subgraph construction. In this simplified example, A and B are the only vertices in the constraint graph, and so there is an edge from vertex B to vertex A which represents the maximum dimension of the layout. This edge corresponds to the sink to source edge 303 illustrated in FIG. 6. In this example, the edge has a length of 8.

FIG. 10b illustrates the constraint graph in its compacted form after graph solution by the graph solver 140. All vertices are in their leftmost legal position, and the vertices are here labeled with their updated vertex locations following compaction.

Figure 10C:
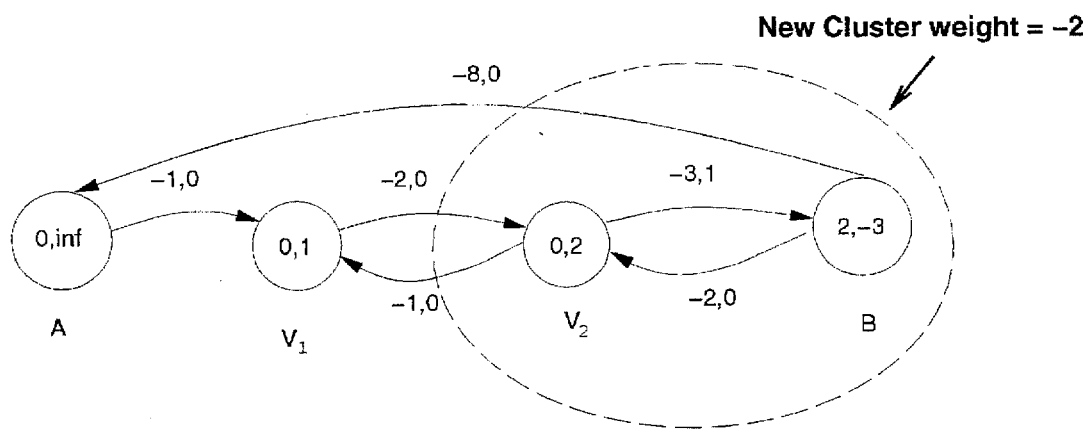

Using a conventional wire length minimizer, vertex B is placed in the queue, and then processed. In FIG. 10c, vertex B is shown after being moved to location 2 where it "slams" into implicit vertex $v_1$. Vertex B is then merged with implicit vertex $v_1$. The resulting cluster has weight equal to the difference between the summed fanin edges and summed fanout here edges, here, $-3+1=-2$. The combined cluster is represented by the dotted line around vertex B and implicit vertex $v_1$. Because the weight of the cluster is negative, it is requeued.

Figure 10D:
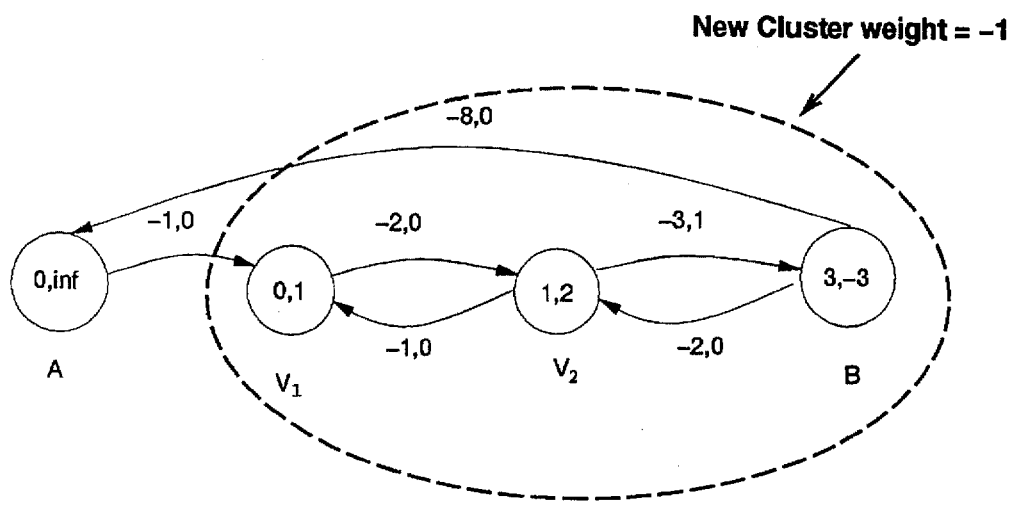

In FIG. 10d, the cluster with weight $-2$ continues moving to the right until it slams into implicit vertex $v_2$. Again, the cluster is now merged with implicit vertex $v_2$. The new cluster weight is $1+-2=-1$. Again, the cluster is requeued.

Figure 10E:
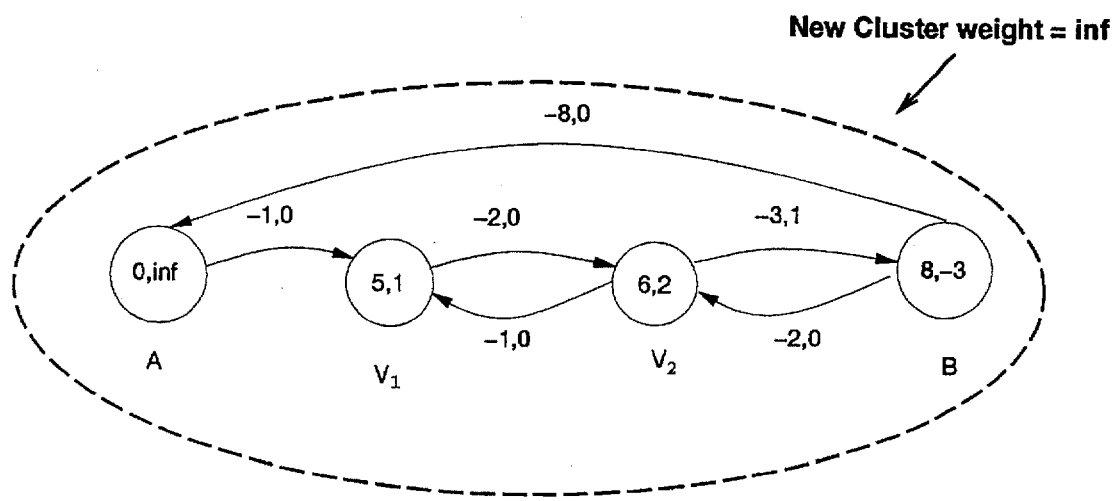

In FIG. 10e, the cluster slams into the top edge. Vertex A is absorbed into the cluster and the weight of the cluster becomes positive infinity. This is the final configuration of the graph, which is now the minimum configuration for the subgraph. Each of the vertices is now labeled to show their location in the constraint graph 250d. This location is extracted for the layout objects that vertices represent. In this configuration, with these locations, the cost function F that was originally applied to the constraint graph is minimized, and hence the performance criteria that is modelled by cost function F is optimally satisfied.

In summary then the result of this process, when applied to the constraint graph 250e will be a minimized, "expanded" constraint graph 250d. The positions of the circuit objects are then extracted from the positions of the explicit vertices in the constraint graph 250d, and updated 212 to the layout database 180. The process is repeated a second time for the perpendicular layout direction. The integrated circuit may then be fabricated 214.

This implementation of the invention will produce a constraint graph and circuit layout the optimally increases fabrication yield, or any other performance criteria for which a cost model 190 is applied. However, while a conventional network flow algorithm, such as the wire length minimization algorithm may be used in this manner, there are performance limitations associated with it. In particular, because the constraint graph 250e is actually expanded, substantial memory is required to stored the additional edges and vertices as separate data structures in memory. If then are M edges 303 in the constraint graph 250, and N is determined for the number of segments in the piecewise linear cost functions F, then there are an additional M*(N-1) vertices 301 to be stored, along with M*(2N-1) additional edges 303. This extra data results in relatively slow processing speeds for running the minimization, as additional data structures must be accessed from memory, and the determination of vertex weights and so forth applied to each vertex, both implicit and explicit.

Accordingly, it is desirable to enhance the conventional wire length minimization algorithm to operate directly on the piecewise linear cost functions 315 in the edges 303 without having to expand 211 the constraint graph 250c with the subgraphs. That is, the constraint graph is made to simulate the behavior of the expanded constraint graph during minimization of the constraint graph by some network flow algorithm. This may be achieved modification of the data structures of the edges and vertices of the original constraint graph. In one embodiment, this is done by providing useful attributes and methods within the edge and vertex data structures to perform the particular operations needed during minimization 210. These attributes and methods make the explicit vertices behave as if the implicit vertices where present, without actually separate constraint graph objects being allocated for them.

TABLE 3

Additional Edge Attributes and Methods

Edge Attributes

| | |
|---|---|
| PWL Cost Funciton | List of [offset from location of fanout vertex, slope S] |

TABLE 3-continued

Additional Edge Attributes and Methods

| | |
|---|---|
| List of Implicit Vertices | List of: [weight of implicit vertex, absolute location, (tag ∈{A, B, U})] A: indicates implicit vertex is clustered with fanout vertex. B: indicates implicit vertex is clustered with fanin vertex U: indicates that implicit vertex is not clustered with a vertex. |
| Edge Methods | |
| int Length( ) | Returns distance D between fanout vertex and fanout vertex in the compaction direction. D = fanin.location - fanout.location |
| int Get_Fanin_Slack( ) | Returns the slack between the fanin vertex and the next implicit vertex between the fanin vertex and the fanout vertex that is not already clustered with the fanin vertex. This is the distance the fanin vertex may be moved to "hit" the next implicit vertex. Return is ≧0. |
| int Get_Fanout_Slack( ): | Returns the slack between the fanout vertex and the next implicit vertex that is not associated the fanout vertex, or the next explicit vertex. This is the distance the fanout vertex may be moved to "hit" the next vertex. Return is ≧0. |
| int BuildFanoutCluster( ) | Updates to "A" the tag of the first implicit vertex (counting from the fanout) in the list of implicit vertices that is currently tagged "U". This indicates that the implicit vertex is now associated with the fanout vertex A. Returns the weight of the updated implicit vertex. If no vertex tagged U exists then the method merges the supervertex cluster of A and B and returns the combined weight of the new supervertex cluster. |
| int BuildFaninCluster( ) | Updates to "B" the tag of the first implicit vertex (counting from the fanin side) in the list of implicit vertices that is currently tagged "U". This indicates that the implicit vertex is now associated with the fanin vertex B. Returns the weight of the updated implicit vertex. If no vertex tagged U exists then the method merges the supervertex cluster of B and A and returns the combined weight of the new supervertex cluster. |
| int FaninWeight | Returns the slope S from the PWL Cost Function that is indexed to the first non-B tagged implicit vertex (counting from the fanin side). |
| int FanoutWeight( ) | Returns the slope S from the PWL Cost Function that is indexed to the first non-A tagged implicit vertex (counting from the fanout side). |

TABLE 4

Vertex Methods

| Vertex Methods | |
|---|---|
| int setWeight( ) | Sum(fanin_edge.FaninWeight)- Sum(fanout_edge.FanoutWeight) for all fanout edges and fanin edges in list thereof. |
| [int, Edge] Slack( ) | Calls the FanoutSlack on each fanout edges, and FaninSlack on each fanin edge. Returns: 1) the number, ≧0 of slack of the smallest amount, and 2) the edge E that had smallest slack amount. |
| void incWeight (weight) | Increments the weight of the vertex by the passed in weight. |

In the revised edge definition, the piecewise linear cost function is specifically represented as a list of coordinate offsets, and weights associated with the location, as determined by the piecewise linear cost function module 160. The list of implicit vertices is used instead of representing each implicit vertex as its own object in the constraint graph 250. Each implicit vertex is associated with either the fanin or fanout vertex of the edge, or it is not associated with one of these vertices at all (i.e. its in the "middle"). The association is by tagging, here with the "A" tag indicating association with the fanout vertex, the "B" tag indicating association with the fanin vertex, and the "U" tag indicating no association.

Implicit vertices in the list are tagged as the fanin or fanout vertex is moved to and hits the location of the implicit vertex during processing by the improved wire length minimizer 150. When an implicit vertex becomes associated ("tagged") with one of the explicit vertices, the weight of the explicit vertex is updated by the weight of the implicit vertex, as held in the piecewise linear cost function list data. This data is retrieved by the appropriate FaninWeight or FanoutWeight method, depending on which explicit vertex is being updated. The updating of the vertex weight is performed by the incWeight method of the vertex being updated. The Slack( ) method is used by the improved wire length minimizer 150 to determine which of the edges has smallest amount of slack, i.e. that is "closest" to the location of the explicit vertex.

It is possible to include the definition of the implicit vertices in the edges in this manner because the weight of each implicit vertex is positive. As a result, the implicit vertices would not be placed on the queue to begin with, and thus would never be processed individually by the wire length minimization algorithm. Thus, it is only necessary to cause the explicit vertices to behave as vertex clusters formed of selected ones of the implicit vertices. Storing the data that would otherwise be used to create the implicit vertices in edges of the constraint graph, along with changing the operation of the vertex methods, allows the explicit vertices to behave in this manner, and thereby improves the performance of the system.

The operation improved wire length minimizer 150 as follows:

1) The wire length minimizer 150 initializes the edge states in the constraint graph 250c. This involves finding the implicit vertex locations of an edge E such that the subgraph (if it existed) would be in its minimum configuration and the "total length" of the subgraph is the current length of the edge E. This operation involves making segment S1 as large as possible while not going beyond the length of E then making segment S2 as large as possible, and so forth, for each segment Sn of the piecewise linear cost function stored in the edge E.

2) The wire length minimizer 150 sets the weight of the source vertex $v_L$ to positive infinity. This ensures that this vertex remains fixed in the constraint graph 250c, thereby providing a fixed reference point.

3) The wire length minimizer 150 traverses the constraint graph 250c and sets the weight of each vertex, except the source vertex $v_L$, to the sum of the fanin edge weights of the vertex minus the sum of the fanout edge weights. This is done by calling the setWeight( ) methods of the vertices, which in turn call FaninWeight and FanoutWeight on their respective edges.

4) The wire length minimizer 150 then creates one vertex cluster for each vertex in the constraint graph 250. Again, no vertex cluster is made the implicit vertices in the subgraphs, as would be done in a conventional wire length minimizer, since the information defining these vertices is already stored internally to the edges of the constraint graph. The wire length minimizer 150 initializes each such cluster to contain exactly one vertex. The weight of the cluster is set as the sum of the weights of the vertices in it. Hence, initially the weight of each cluster is the weight of the vertex it contains.

3) The wire length minimizer 150 then places all negative weight vertex clusters on the queue. This queue will be processed until it is empty.

4) The wire length minimizer 150 pops a super cluster C from the queue.

5) The wire length minimizer 150 examines all the external fanout and fanin edges of the vertex cluster C to find the edge E with the smallest slack. External fanout edges are fanout edges of vertices in C for which the fanin vertex is not in C, that is, an edge originating or terminating from a vertex outside the cluster. The slack is the amount the location of the vertices corresponding to edge E can be moved without violating any constraint on the edge. It turns out that the smallest slack value is the amount by which all the vertices in C can be collectively moved without violating a constraint on any edge in the cluster. This step may be done by calling the Slack( ) of the vertex, which in turns calls the appropriate slack methods of the edges.

6) Accordingly, the wire length minimizer 150 moves all the vertices in C the to right (increase their coordinate location value) by the slack value of E just determined.

7) At this point a conventional wire length minimizer, working on an fully expanded constraint graph with implicit vertices actually stored in memory would merge C with the vertex cluster on the "other side" of E, that is the fanin vertex of E. This fanin vertex would include the next implicit vertex. The weight of the merged cluster is the sum of the weights of the two clusters.

However, in the improved wire length minimizer 150, where the constraint graph 250c does not actually store the implicit vertices in an explicit manner, this effect is achieved (with superior performance) by incrementing the weight of the vertex in C corresponding to edge E by the value returned by the method BuildFanoutCluster (or BuildFaninCluster). The weight of the cluster is also updated. Specifically, these methods update the weight of C by the weight of the next vertex cluster that is associated with the next implicit or explicit vertex that is not already a part of the cluster. In other words, the cluster is "moved" just incrementally by the distance to where the next implicit or explicit vertex would physically be, even though that vertex may not be actually represented. The weight of the cluster is updated by the weight of this implicit vertex or explicit vertex cluster.

8) Finally, the wire length minimizer 150 determines whether the weight of the new cluster is negative, and if so, places it on the queue.

9) The wire length minimizer 150 then returns to step 4.

Accordingly, using the improved wire length minimizer 150, the constraint graph 250c is minimized to determine the locations of the layout objects that optimally satisfies any number of simultaneous performance criteria for a fixed area. The improved wire length minimizer 150 produces this result without the extensive overhead required by a conventional network flow algorithm.

TABLE 5

Relative Reduction of Spot Defects Using Yield Optimization with Fixed Area

| Name | Design Style | Size | Fault Reduction | CPU Time (sec) Yield | Total |
|---|---|---|---|---|---|
| lev4 | custom | 10 k | 12.4% | 4 | 11 |
| bpr10 | macro-cell | 20 k | 12.7% | 13 | 30 |
| bpr12 | standard cell | 6 k | 8.2% | 1 | 3 |
| bpr14 | macro-cell | 1 k | 18.2% | <1 | <1 |
| bpr21 | macro-cell | 6.5 k | 17.9% | 1 | 7 |
| bpr22 | macro-cell | 6 k | 8.6% | 1 | 6 |
| bpr23 | macro-cell | 25 k | 13.7% | 48 | 55 |
| bpr24 | macro-cell | 5 k | 14.7% | 4 | 7 |
| Average Fault Reduction | | | 13.3% | | |

Table 5 shows the result of applying the yield optimization process using minimum area on a few industrial test cases. Both yield and wire length were simultaneously optimized. The times include the time necessary for compaction, and data input and output. For each test case compaction is first performed and the probability of faults due to spot defects is computed before and after yield optimization using the distribution described in Eq. 3. The fault reduction column in Table 5 shows the computed percentage of reduction in the number of faults due to spot defects. The size of the layout is the number of constraint graph vertices which is approximately the number of objects in the layout. The number of segments used in the piecewise linear approximation is about four. All these test cases show a significant improvement in yield even though area was maintained at its minimum size and the layouts were quite tight. For instance, for test case bpr10, the probability of having a fault due to spot defects was reduced by 12.7% by using the optimization process described herein. As noted above, even a single percent decrease in the total yield may be worth in excess of $10M. Thus, the present invention provides significant cost savings.

Figure 11:
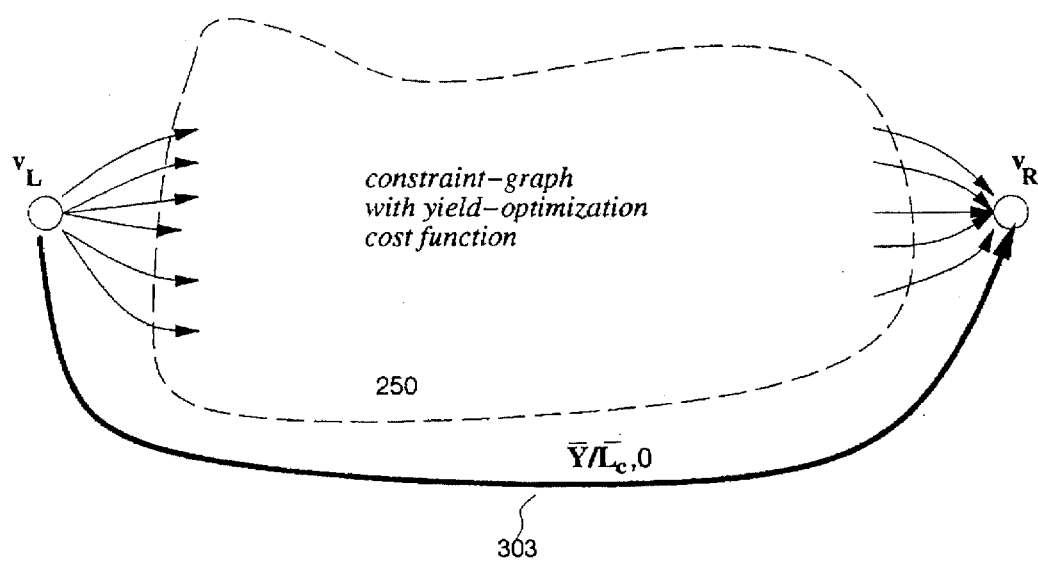
FIG. 11 is an illustration of a constraint graph of a layout with an added edge for maximum yield per area.

Referring again to FIG. 2, once the selected performance criteria have been optimized with fixed area, additional optimization passes may be made to produce a maximum number of good circuits per wafer, by allowing circuit area to increase. This is done by replacing the sink $v_R$ to source $v_L$ edge added in the first pass with a source to sink edge (backward edge). This edge has a weight equal to the ratio of the value of the optimized cost functions to the minimized area, as originally determined by the graph solver 140. For example, if only yield is optimized originally, such that the resulting constraint graph 250d has a minimum area $L_c$ and a yield of Y, then the weight of the new edge is $Y/L_c$, and the length constraint of the edge is 0. FIG. 11 illustrates the constraint graph 250 with an edge 303 with this weight.

More generally, if all of the selected performance criteria, having multiple cost functions that are optimized with a single cost function $C_m$ which produces a total cost for the constraint graph 250d of $T_c$ then to determine the maximum number of circuits per wafer the source to sink edge is given a weight of $T_c/L_c$. Note that these values are fixed, and are not updated during the next optimization pass. The constraint graph 250c is then minimized 210 (or 211) again, this time resulting in a maximum number of integrated circuits per wafer area.

We claim:

1. In a computer aided design apparatus for defining a system, the apparatus including a database storing a structural description of the system, the structural description including a plurality of objects, each object having a binary relationship with at least one other object, a computer implemented method for optimizing at least one performance criteria of the system, where each performance criteria is described by at least one convex cost function, the method comprising:

a) creating from the structural description of the system a constraint graph of the system, with each object in the structural description represented by a vertex in the constraint graph, and each binary relationship between two objects represented by an edge between the vertices representing the objects;

b) for each edge of the constraint graph:
   i) associating a cost function with the edge according to the objects represented by the vertices coupled to the edge;
   ii) converting the cost function to a convex piecewise linear cost function approximating the cost function;

c) minimizing the constraint graph by minimizing a total cost of all edges with the attached convex piecewise linear cost function on each edge; and, d) extracting a structural description of the system from the minimized constraint graph, wherein each performance criteria is optimized.

2. The computer implemented method of claim 1, wherein the cost function applied to an edge is a combination of a plurality of cost functions.

3. The computer implemented method of claim 1, wherein the cost function applied to an edge is a combination of a plurality of cost functions for a plurality of performance criteria.

4. The computer implemented method of claim 1, wherein the system is an electrical circuit, the objects are layout objects, and the binary relationship between two layout objects is a function of a distance between the two layout objects.

5. The computer implemented method of claim 4, wherein at least one cost function is selected from a group comprising:
   a) a yield cost function;
   b) a cross-talk cost function;
   c) a wire length cost function; and,
   d) a power consumption cost function.

6. The computer implemented method of claim 1, wherein each convex piecewise linear cost function has N segments, and N-1 transitions between segments, wherein minimizing the constraint graph comprises:
   a) for each edge coupling two vertices, expanding the constraint graph by replacing the edge with a subgraph having at least one edge for each of the N segments of the piecewise linear cost function and a vertex for each of the N-1 transitions between segments; and,
   b) minimizing the total cost of the edges of the expanded constraint graph using a network flow algorithm.

7. The computer implemented method of claim 6, wherein expanding the constraint graph by replacing the edge with a subgraph comprises:
   a) labeling the vertices coupling the edge as $V_N$ and $V_0$;
   b) for each of the i=1 to N-1 transitions of the piecewise linear cost function, each transition having a coordinate value $x_{i+1}$, storing a vertex $V_i$ in the constraint graph;
   c) for each vertex $V_i$ where i=1 to N, storing in the constraint graph a directed edge from vertex $V_i$ to vertex $V_{i-1}$, and storing for the edge a weight equal to $(S_i+k)$, where $S_1$ is the slope of a segment of the piecewise linear cost function starting at $x_i$ and k is an arbitrary number, and a constraint $D_{min}$, where $D_{min}$ is 0 if i>1, and $D_{min}$ is $x_1$ where i=1; and,
   d) for each vertex $V_i$ where i=1 to N-1, storing in the constraint graph a directed edge from vertex $V_{i-1}$ to vertex $V_i$, and storing for the edge a weight equal to k and a constraint $D_{min}$, where $D_{min}$ is $(x_i-x_{i+1})$ if i>1, and $D_{min}$ is $-x_2$ where i=1.

8. The computer implemented method of claim 6, wherein expanding the constraint graph by replacing the edge with a subgraph comprises:
   a) labeling the vertices coupling the edge as $V_N$ and $V_{-1}$;
   b) for each of the i=1 to N-1 transitions of the piecewise linear cost function, each transition having a coordinate value $x_{i+1}$, storing a vertex $V_i$ in the constraint graph;
   c) storing a vertex $V_0$;
   d) for each vertex $V_i$ where i=1 to N storing in the constraint graph a directed edge from vertex $V_i$ to vertex $V_{i-1}$, and storing for the edge a weight equal to $(S_i+k)$, where $S_i$ is the slope of a segment of the piecewise linear cost function starting at $x_i$ and k is an arbitrary number, and a constraint $D_{min}$ equal to 0;
   e) storing an edge from vertex $V_0$ and vertex $V_{-1}$ having a weight of any value and a constraint $D_{min}$ equal to $x_1$;
   f) storing an edge from vertex $V_{-1}$ and vertex $V_0$ having a weight of any value and a constraint $D_{min}$ equal to $-x_1$; and,
   g) for each vertex $V_i$ where i=1 to N-1, storing in the constraint graph a directed edge from vertex $V_{i-1}$ to vertex $V_i$, and storing for the edge a weight equal to k and a constraint $D_{min}$ equal to $(x_i-x_{i+1})$.

9. The computer implemented method of claim 6, wherein expanding the constraint graph by replacing the edge with a subgraph comprises:
   a) labeling the vertices coupling the edge as $V_N$ and $V_{-1}$;
   b) for each of the i=1 to N-1 transitions of the piecewise linear cost function, each transition having a coordinate value $x_{i+1}$, storing a vertex $V_i$ in the constraint graph;
   c) storing a vertex $V_0$;
   d) for each vertex $V_i$ where i=1 to N storing in the constraint graph a directed edge from vertex $V_i$ to vertex $V_{i-1}$, and storing for the edge a weight equal to $(S_i+k)$, where $S_i$ is the slope of a segment of the piecewise linear cost function starting at $x_i$ and k is an arbitrary number, and a constraint $D_{min}$ equal to 0;
   e) storing an edge from vertex $V_0$ and vertex $V_{-1}$ having a weight equal to a substantially large value, and a constraint $D_{min}$ equal to $x_1$; and,
   f) for each vertex $V_i$ where i=1 to N-1 storing in the constraint graph a directed edge from vertex $V_{i-1}$ to vertex $V_i$, and storing for the edge a weight equal to k and a constraint $D_{min}$ equal to $(x_i-x_{i+1})$.

10. The computer implemented method of claim 6, wherein the network flow algorithm is a wire length minimization algorithm.

11. The computer implemented method of claim 1, wherein each cost function has the form:

$$C(d) = L\alpha e^{-\beta d}$$

where:

d is a distance between adjacent objects in the system in a first direction;

L is length for which adjacent objects face each other in a second direction perpendicular to the first direction;

α is first manufacturing technology dependent constant; and,

β is a second manufacturing technology dependent constant.

12. In a computer aided design system for designing integrated circuits, computer memory including a constraint graph of an integrated circuit including a plurality of circuit elements, each circuit element having a binary relationship with at least one other circuit element, the memory readable by a processor in system for optimizing the placement of circuit elements as a function of at least one performance criteria cost model, the constraint graph in the computer memory comprising:

a) a plurality of vertices, each vertex corresponding to at least one circuit element, each vertex having a weight; and, b) a plurality of edges, each edge coupling the vertices corresponding circuit elements having a binary relationship, each edge further including a convex piecewise linear cost function for at least one performance criteria cost model.

13. A computer readable memory operable in a computer aided design apparatus for defining a system, the apparatus including a processor and a database storing a structural description of the system, the structural description including a plurality of objects, each object having a binary relationship with at least one other object, the computer readable memory comprising:

a computer program for performing a computer implemented method for optimizing at least one performance criteria of the system, where each performance criteria is described by at least one convex cost function, the method comprising:

a) creating from the structural description of the system a constraint graph of the system, with each object in the structural description represented by a vertex in the constraint graph, and each binary relationship between two objects represented by an edge between the vertices representing the objects;

b) for each edge of the constraint graph:

i) associating a cost function with the edge according to the objects represented by the vertices coupled to the edge;

ii) converting the cost function to a convex piecewise linear cost function approximating the cost function;

c) minimizing the constraint graph by minimizing a total cost of all edges with the attached convex piecewise linear cost function on each edge; and, d) extracting a structural description of the system from the minimized constraint graph, wherein each performance criteria is optimized.

14. In a computer aided design apparatus for defining a system, the apparatus including a database storing a structural description of the system, the structural description including a plurality of objects, each object having a binary relationship with at least one other object, each binary relationship having a cost that is determined by a convex cost function, a computer implemented method for optimizing the total costs of all binary relationships, comprising:

approximating each convex cost function of the binary relationships with a piecewise linear cost function;

transforming each piecewise linear cost function into a plurality of linear cost functions; and, solving the plurality of linear cost functions.

15. A computer aided design apparatus for optimizing at least one performance criteria of an integrated circuit, comprising:

a database storing a structural description of the integrated circuit, the structural description including a plurality of layout objects, each layout object having a binary relationship with at least one other layout object, each binary relationship having a cost as a function of a distance between the layout objects;

a computer readable memory storing at least one convex cost function for each performance criteria;

the computer readable memory further storing for execution by a processor:

a compactor coupled to the database that creates from the structural description therein a constraint graph of the integrated circuit, with each layout object in the structural description represented by a vertex in the constraint graph, and each binary relationship between two layout objects represented by an edge between the vertices representing the objects, the compactor storing the constraint graph in the memory;

a cost function module that associates with each edge of the constraint graph a cost function with the edge according to the layout objects represented by the vertices coupled to the edge;

a piecewise linear cost function module that converts the cost function of each edge to a convex piecewise linear cost function approximating the cost function; and, a constraint graph minimizer that minimizes the constraint graph by minimizing a total cost of all edges with the attached convex piecewise linear cost function on each edge, and updates the structural description of the integrated circuit in the database.

* * * * *

UNITED STATES PATENT AND TRADEMARK OFFICE
CERTIFICATE OF CORRECTION

PATENT NO. : 5,663,891

DATED : September 2, 1997

INVENTOR(S) : Cyrus Bamji and Enrico Malavasi

It is certified that error appears in the above-identified patent and that said Letters Patent is hereby corrected as shown below:

In the Abstract

Line 6, replace "of system" with --of the system--.

Line 14, replace "optimized" with --be optimized--.

Column 2, line 24, after "provide" insert --an--.

Column 2, line 58, replace "criteria" with --criterion--.

Column 4, line 49, replace "is a" with --is an--.

Column 6, line 55, replace "including" with --include--.

Column 8, line 1, replace "function" with --approximation--.

Column 9, line 53, replace "chose" with --choose--.

Column 11, line 18, replace "that the may" with --that may--.

Column 11, line 60, after "($x_1$, $F_1$)" insert a period, --.--.

Column 13, line 22, replace "to behaved" with --behaved--.

Column 13, line 34, after "that it" insert --is--.

Column 13, line 59, replace "as" with --has--.

Column 14, line 44, replace "that" with --that is--.

Column 16, line 16, after "then" insert a comma --,--.

Column 16, line 32, replace "stored" with --store--.

Column 16, line 33, replace "then" with --there--.

UNITED STATES PATENT AND TRADEMARK OFFICE
CERTIFICATE OF CORRECTION

PATENT NO. : 5,663,891

DATED : September 2, 1997

INVENTOR(S) : Cyrus Bamji and Enrico Malavasi

It is certified that error appears in the above-identified patent and that said Letters Patent is hereby corrected as shown below:

Column 16, line 50, replace "achieved" with --achieved by--

Column 17, line 14, replace "fanout vertex" with --fanin vertex--.

Column 18, line 40, replace "operation improved wire length minimizer 150 as follows" with -- operation of the improved wire length minimizer 150 is as follows--.

Column 19, line 32, replace "an" with --a--.

Column 19 line 63, replace "satisfies" with --satisfy--.

Column 20, line 58, replace "per wafer the" with --per wafer, the--.

Signed and Sealed this

Twenty-second Day of December, 1998

Attest:

BRUCE LEHMAN

Attesting Officer

Commissioner of Patents and Trademarks